(12) United States Patent
Kawaguchi et al.

(10) Patent No.: US 12,531,512 B2
(45) Date of Patent: Jan. 20, 2026

(54) BULK ACOUSTIC WAVE BASED CLOCKS FOR TIMING DEVICES

(71) Applicant: CHORUSVIEW, INC., Las Vegas, NV (US)

(72) Inventors: Dean Mamoru Kawaguchi, San Jose, CA (US); Edward Maurice Farrell, Saratoga, CA (US)

(73) Assignee: Chorusview, Inc., Las Vegas, NV (US)

( * ) Notice: Subject to any disclaimer, the term of this patent is extended or adjusted under 35 U.S.C. 154(b) by 5 days.

(21) Appl. No.: 18/767,285

(22) Filed: Jul. 9, 2024

(65) Prior Publication Data

US 2025/0038707 A1  Jan. 30, 2025

Related U.S. Application Data

(60) Provisional application No. 63/528,710, filed on Jul. 25, 2023.

(51) Int. Cl.
  *H03B 5/32* (2006.01)
  *H03B 5/04* (2006.01)
  *H03B 5/36* (2006.01)
(52) U.S. Cl.
  CPC ........... *H03B 5/326* (2013.01); *H03B 5/04* (2013.01); *H03B 5/36* (2013.01)
(58) Field of Classification Search
  CPC .. H03B 5/326; H03B 5/04; H03B 5/36; B60B 1/0215
  See application file for complete search history.

(56) References Cited

U.S. PATENT DOCUMENTS

| 4,349,794 A | 9/1982 | Kagiwada et al. |
| 4,656,463 A | 4/1987 | Anders et al. |
| 4,746,830 A | 5/1988 | Holland |
| 5,456,779 A | 10/1995 | Sinha |
| 5,599,205 A | 2/1997 | Cronin |

(Continued)

FOREIGN PATENT DOCUMENTS

| CN | 1632475 A | 6/2005 |
| CN | 201007826 Y | 1/2008 |

(Continued)

OTHER PUBLICATIONS

International Preliminary Report on Patentability for International Application No. PCT/US2020/035303, Nov. 16, 2021, 6 Pages.

(Continued)

*Primary Examiner* — Jeffrey M Shin
(74) *Attorney, Agent, or Firm* — Botos Churchill IP Law

(57) ABSTRACT

Aspects of the disclosure provide a method of using a bulk acoustic wave (BAW) based clock. For example, a first burst pulse of ultrasonic waves may be received by a transmit transducer of a BAW delay device. A feedthrough pulse from the first burst pulse may be received at a receive transducer of the BAW delay device. After receiving the feedthrough pulse, a first echo pulse from the first burst pulse may be received at the receive transducer. The first pulse may be a reflection of a portion of the first burst pulse from a substrate. A difference in time between the receipt of the feedthrough pulse and the receipt of the first echo pulse may be used to control timing of a second burst pulse of ultrasonic waves.

18 Claims, 23 Drawing Sheets

(56) References Cited

U.S. PATENT DOCUMENTS

| | | |
|---|---|---|
| 6,833,767 B1 | 12/2004 | Huff et al. |
| 7,319,397 B2 | 1/2008 | Chung et al. |
| 7,548,152 B2 | 6/2009 | Hillier |
| 8,917,159 B2 | 12/2014 | Mcallister et al. |
| 8,933,801 B2 | 1/2015 | Sweeney et al. |
| 8,994,586 B1 | 3/2015 | Choi et al. |
| 9,087,246 B1 | 7/2015 | Chin et al. |
| 9,411,992 B1 | 8/2016 | Marek et al. |
| 9,613,237 B2 | 4/2017 | Nikunen et al. |
| 9,699,655 B1 | 7/2017 | Silis |
| 9,712,963 B2 | 7/2017 | Kim et al. |
| 10,381,710 B1 | 8/2019 | Kuo et al. |
| 10,990,922 B1 | 4/2021 | Subramanian et al. |
| 11,030,425 B2 | 6/2021 | Kawaguchi et al. |
| 11,195,073 B2 | 12/2021 | Kawaguchi et al. |
| 2002/0029341 A1 | 3/2002 | Juels et al. |
| 2003/0080978 A1 | 5/2003 | Navab et al. |
| 2003/0104848 A1 | 6/2003 | Brideglall |
| 2004/0030894 A1 | 2/2004 | Labrou et al. |
| 2004/0146114 A1 | 7/2004 | Gerrits et al. |
| 2005/0236478 A1 | 10/2005 | St et al. |
| 2006/0174129 A1 | 8/2006 | Brignone et al. |
| 2006/0283252 A1 | 12/2006 | Liu et al. |
| 2007/0146083 A1 | 6/2007 | Hein et al. |
| 2007/0279231 A1 | 12/2007 | Cheng et al. |
| 2008/0036649 A1 | 2/2008 | Lyon |
| 2008/0096726 A1 | 4/2008 | Riley et al. |
| 2008/0143532 A1 | 6/2008 | Murrah |
| 2008/0186245 A1 | 8/2008 | Hilgers |
| 2010/0019955 A1 | 1/2010 | Durgin |
| 2010/0052869 A1 | 3/2010 | Stewart |
| 2010/0060434 A1 | 3/2010 | Shiotsu et al. |
| 2010/0097223 A1 | 4/2010 | Kruest et al. |
| 2010/0271994 A1 | 10/2010 | Wolfe |
| 2011/0107102 A1 | 5/2011 | Canard et al. |
| 2011/0234397 A1 | 9/2011 | Fetzer et al. |
| 2011/0243120 A1 | 10/2011 | Ginsburg et al. |
| 2011/0285511 A1 | 11/2011 | Maguire et al. |
| 2012/0076184 A1 | 3/2012 | Tran et al. |
| 2012/0238216 A1 | 9/2012 | Hallowell et al. |
| 2013/0099920 A1 | 4/2013 | Song et al. |
| 2013/0211270 A1 | 8/2013 | St et al. |
| 2013/0217332 A1 | 8/2013 | Altman et al. |
| 2014/0133656 A1 | 5/2014 | Wurster et al. |
| 2014/0253295 A1 | 9/2014 | Roberts et al. |
| 2014/0278125 A1 | 9/2014 | Balakrishnan et al. |
| 2015/0007347 A1 | 1/2015 | Rajakarunanayake et al. |
| 2015/0022016 A1 | 1/2015 | Kim et al. |
| 2015/0186694 A1 | 7/2015 | Fessler et al. |
| 2015/0253362 A1 | 9/2015 | Louzir et al. |
| 2015/0262123 A1 | 9/2015 | Sharma et al. |
| 2015/0296476 A1 | 10/2015 | Wilmhoff et al. |
| 2015/0332573 A1 | 11/2015 | Selmanovic et al. |
| 2015/0347945 A1 | 12/2015 | Reese et al. |
| 2016/0021079 A1 | 1/2016 | Schimmelpfeng et al. |
| 2016/0063286 A1 | 3/2016 | Nikunen et al. |
| 2016/0086406 A1 | 3/2016 | Baumgarte |
| 2016/0148440 A1 | 5/2016 | Kwak |
| 2016/0277879 A1 | 9/2016 | Daoura et al. |
| 2016/0294829 A1 | 10/2016 | Angus |
| 2017/0039784 A1 | 2/2017 | Gelbart et al. |
| 2017/0104467 A1 | 4/2017 | Nikitin et al. |
| 2017/0161679 A1 | 6/2017 | Stingel et al. |
| 2017/0167287 A1 | 6/2017 | Jacobs et al. |
| 2017/0180919 A1 | 6/2017 | Rittner |
| 2017/0270323 A1 | 9/2017 | Butler et al. |
| 2017/0281060 A1 | 10/2017 | Wedekind et al. |
| 2017/0286820 A1 | 10/2017 | Nikunen et al. |
| 2018/0019621 A1 | 1/2018 | Lin et al. |
| 2018/0049003 A1 | 2/2018 | Maulsby et al. |
| 2018/0262894 A1 | 9/2018 | Daoura et al. |
| 2018/0269586 A1 | 9/2018 | Kawahata |
| 2018/0269909 A1 | 9/2018 | Reynolds |
| 2018/0332009 A1 | 11/2018 | Lange |
| 2019/0122174 A1 | 4/2019 | Gil |
| 2019/0131953 A1 | 5/2019 | Gong et al. |
| 2019/0253409 A1 | 8/2019 | Spencer |
| 2019/0259052 A1 | 8/2019 | Glasson |
| 2019/0325284 A1 | 10/2019 | Forster |
| 2019/0361111 A1 | 11/2019 | Sadiq et al. |
| 2020/0005107 A1 | 1/2020 | Kawaguchi et al. |
| 2020/0030938 A1 | 1/2020 | Knudson et al. |
| 2020/0195259 A1 | 6/2020 | Zhang |
| 2020/0380326 A1* | 12/2020 | Kawaguchi ............ H04B 1/401 |
| 2021/0293541 A1* | 9/2021 | Lal ...................... H05K 1/0306 |
| 2022/0067651 A1 | 3/2022 | Kawaguchi et al. |

FOREIGN PATENT DOCUMENTS

| | | |
|---|---|---|
| CN | 102317809 A | 1/2012 |
| CN | 102656474 A | 9/2012 |
| CN | 202869602 U | 4/2013 |
| CN | 103575315 A | 2/2014 |
| CN | 106030672 A | 10/2016 |
| CN | 106471749 A | 3/2017 |
| EP | 3079104 A1 | 10/2016 |
| JP | H09153123 A | 6/1997 |
| JP | 2013239779 A | 11/2013 |
| JP | 2016053958 A | 4/2016 |
| KR | 20080031014 A | 4/2008 |
| TW | 201827823 A | 8/2018 |
| WO | 2009032637 A2 | 3/2009 |
| WO | 2019232420 A2 | 12/2019 |
| WO | 2020243557 A1 | 12/2020 |
| WO | 2023086248 A1 | 5/2023 |

OTHER PUBLICATIONS

International Search Report and Written Opinion for International Application No. PCT/US2022/048659 dated Mar. 9, 2023 (8 pages).
Notice of Reasons for Refusal for Japanese Patent Application No. 2021-571539, May 27, 2024, 6 Pages.
Office Action issued in corresponding Chinese Patent Application No. 202080055782.2, mailed Mar. 24, 2023, 14 pages.
The Extended European Search Report for European Patent Application No. 19812140.2, Sep. 24, 2021.
The Extended European Search Report for European Patent Application No. 20815635.6, May 8, 2023, 7 Pages.
The International Search Report and the Written Opinion for International Application No. PCT/US2019/034975, Dec. 20, 2019, 22 Pages.
The International Search Report and the Written Opinion for International Application No. PCT/US2020/035303, Sep. 18, 2020, 10 Pages.
"Notice of Allowance", U.S. Appl. No. 16/506,705, filed Sep. 3, 2020.
"Notice of Allowance for Chinese Patent Application No. 201980051198.7, May 2, 2023."

* cited by examiner

100

200

400

420

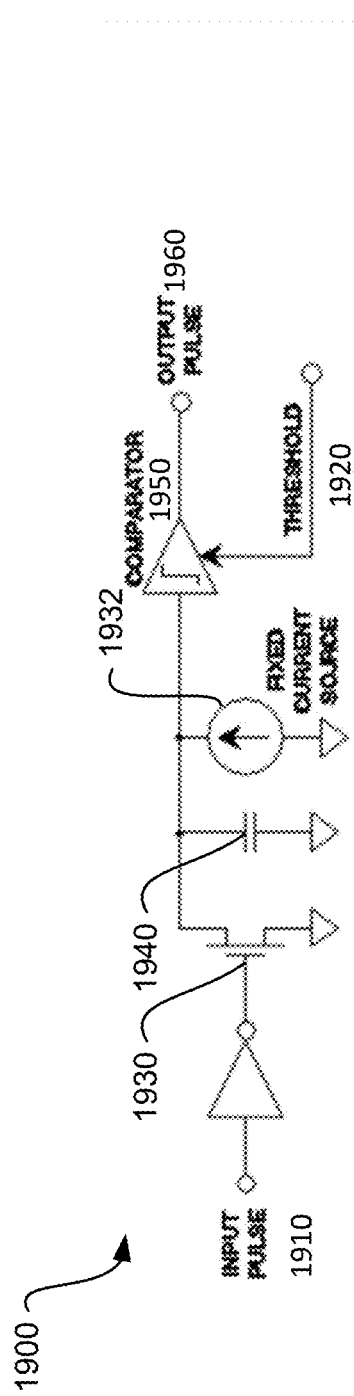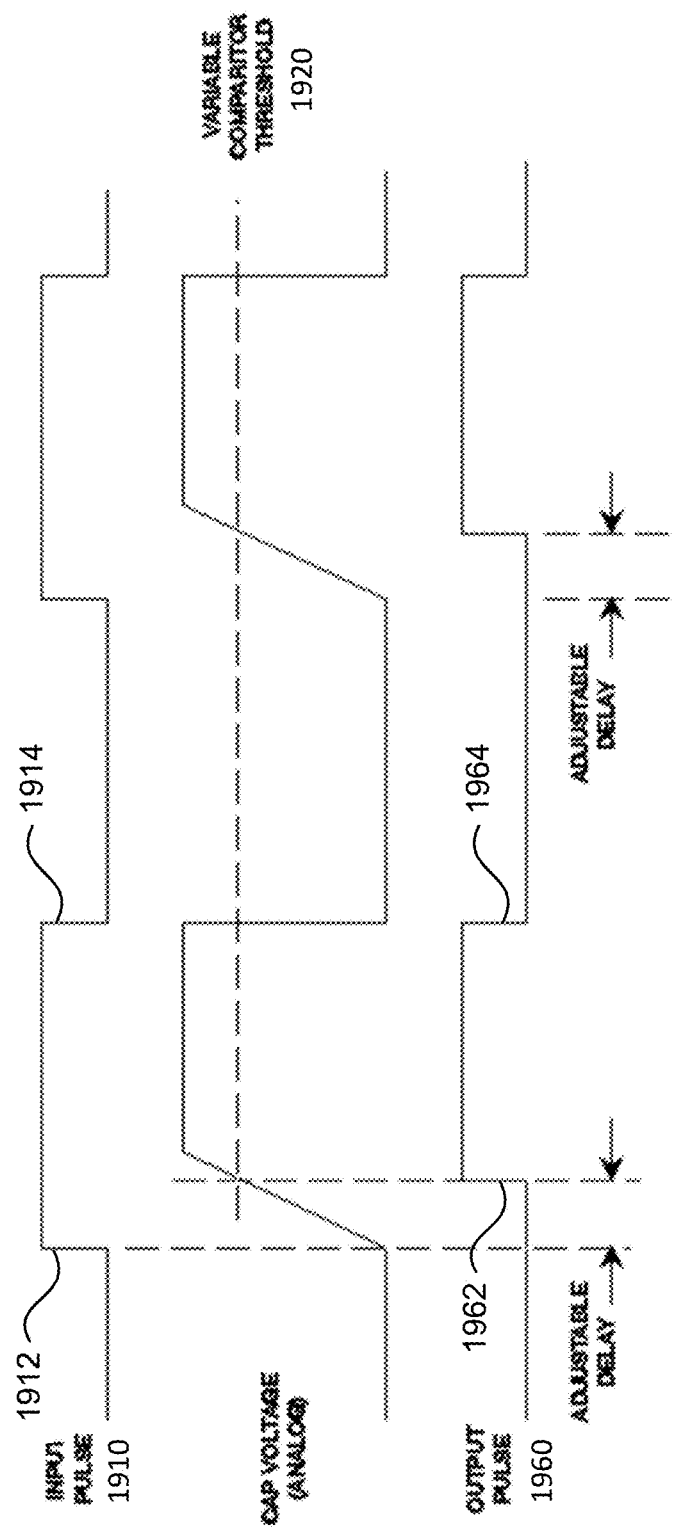
FIGURE 19A
FIGURE 19B

BULK ACOUSTIC WAVE BASED CLOCKS FOR TIMING DEVICES

CROSS-REFERENCE TO RELATED APPLICATION

The present application claims the benefit of the filing date of U.S. Provisional Application No. 63/528,710 filed Jul. 25, 2023, the disclosure of which is hereby incorporated by reference.

BACKGROUND

The Internet of Things (IoT) is the inter-networking of physical objects, such as products, packages, vehicles, buildings, etc., that are embedded with electronic components for network connectivity. The embedded components enable objects to detect others, be detected by others, collect data and/or transmit data. In some examples, the embedded components may include tags or labels attached to the physical objects. These tags or labels may be passive or active. The inter-networking capabilities may be leveraged for tracking locations of physical objects. In many situations, objects may be moved at different points in time, such as a package or equipment moved from a truck to a loading dock to a warehouse, or medical equipment that is moved between different rooms (or floors) in a hospital. These types of situations can be very challenging to determine the location of the object with suitable accuracy, including updating of the location as it changes. In addition, systems that use GPS or WiFi may suffer from signal dropout or transmitters going offline, which can reduce the ability to properly identify an object's location.

BRIEF SUMMARY

Aspects of the disclosure provide for a method. The method includes transmitting, a first burst pulse of ultrasonic waves, by a transmit transducer of a bulk-acoustic wave device (BAW); receiving a feedthrough pulse of the first burst pulse at a receive transducer of the BAW delay device; after receiving the feedthrough pulse, receiving a first echo pulse of the first burst pulse at the receive transducer, the first echo pulse being a reflection of a portion of the first burst pulse from a substrate; using a difference in time between the receipt of the feedthrough pulse and the receipt of the first echo pulse to control timing of a second burst pulse of ultrasonic waves.

In one example, the feedthrough pulse is not an echo pulse. In addition or alternatively, the feedthrough pulse is caused by a coupling between the transmit transducer and the receive transducer. In addition or alternatively, the method also includes, using the first burst pulse and the second burst pulse to control timing of sending beacon signals by a tracking tag. In addition or alternatively, the method also includes waiting a predetermined number of cycles before sending the second burst pulse. In addition or alternatively, using the difference in time includes using first and second comparators and a state machine to control the timing of the second burst pulse. In addition or alternatively, using the difference in time further includes using a voltage-controlled oscillator (VCO) to control the timing of the second burst pulse. In addition or alternatively, the method also includes, using a temperature compensation delay device to adjust for temperature changes affecting thickness of the substrate and the acoustic velocity of the substrate. In addition or alternatively, the method also includes using a fixed offset delay device to adjust for an error resulting from inaccuracies in thickness of the substrate.

Another aspect of the disclosure provides a system. The system includes a substrate; a complementary metal-oxide semiconductor (CMOS) stack arranged on the substrate; and a bulk acoustic wave (BAW) device, the CMOS stack being arranged at least partially between the BAW and the substrate. The BAW delay device includes a transmit transducer configured to transmit a first burst pulse of ultrasonic waves and a receive transducer. The receive transducer is configured to receive a feedthrough pulse of the first burst pulse and after receiving the feedthrough pulse, receive a first echo pulse of the first burst pulse. In this instance, the first echo pulse being a reflection of a portion of the first burst pulse from an edge of the substrate. The system also includes a state machine configured to a difference in time between the receipt of the feedthrough pulse and the receipt of the first echo pulse to control timing of a second burst pulse of ultrasonic waves.

In one example, the feedthrough pulse is not an echo pulse. In addition or alternatively, the feedthrough pulse is caused by a coupling between the transmit transducer and the receive transducer. In addition or alternatively, the system also includes a tracking tag configured to use the first burst pulse and the second burst pulse to control timing of sending beacon signals by the tracking tag. In addition or alternatively, wherein the BAW delay device is further configured to wait a predetermined number of cycles before sending the second burst pulse. In addition or alternatively, the system also includes first and second comparators configured to output signals to the state machine based on timing of the feedthrough pulse and first echo pulse, respectively. In addition or alternatively, the system also includes a voltage-controlled oscillator (VCO) configured to be used by the state machine to control the timing of the second burst pulse. In addition or alternatively, the system also includes a temperature compensation delay device configured to adjust for temperature changes affecting the thickness of the substrate and the temperature variation of the acoustic velocity of the substrate. In addition or alternatively, the system also includes a fixed offset delay device configured to adjust for an error resulting from inaccuracies in thickness of the substrate.

BRIEF DESCRIPTION OF THE DRAWINGS

FIGS. 19A and 19B are example logical schematic of a delay device and representation of various information and signals, respectively, in accordance with aspects of the disclosure.

DETAILED DESCRIPTION

Overview

Figure 1A:
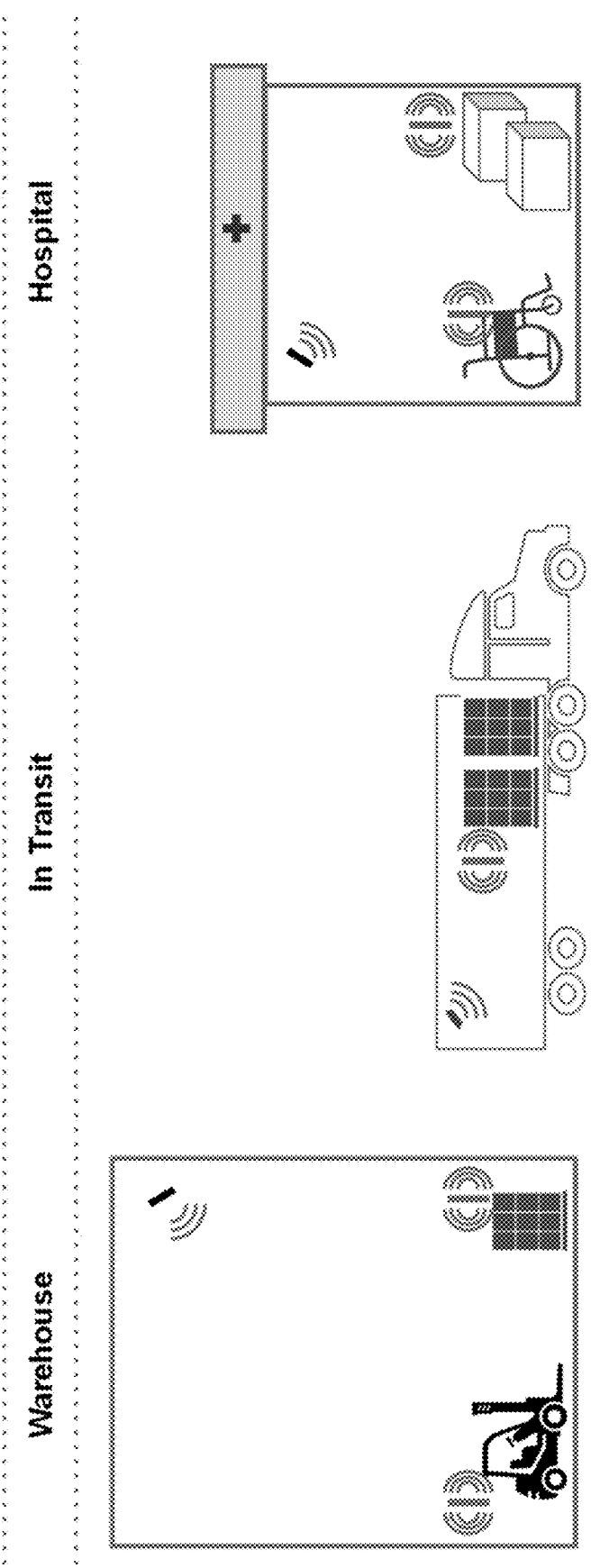
FIG. 1A illustrates various examples for localization of objects in accordance with aspects of the technology.

The technology relates to timing devices and in particular a BAW delay-based clock that can be used as a timing reference. Such timing devices may be used in various applications including, for example, as a basis for sending beacon signals in tracking tags for tracking objects. The features described herein may enable a BAW delay-based clock that utilizes a differential delay without requiring multiple echo pulses as discussed further below.

Some systems may utilize bulk acoustic wave (BAW) delay-based clocks as timing devices for various applications including tracking objects. For instance, a delay-based clock using only one echo pulse of a transmitted burst pulse of ultrasonic waves relative to a trigger for the transmitted burst pulse may be used. Such a single echo pulse based implementation may have clock frequency errors caused by the non-linear delay variation of the echo pulse with respect to temperature in the complementary metal-oxide semiconductor (CMOS) elements of the clock. Such nonlinear delay variations over temperature may be complex and difficult to correct.

In other instances, a differential delay between the first and second echo pulse of the transmitted burst pulse of ultrasonic waves may be used. In such implementations, the non-linear delay variation in the CMOS circuitry used can be largely canceled out in the differential measurement, because both the first and second echo pulses will experience the same nonlinear delay variation over temperature. However, the second echo pulse may have a different frequency dispersive delay slope versus burst frequency than the first echo pulse.

At the same time, using the third echo pulse in the differential delay may result in lower amplitudes with greater distortions in various ways. This may make such implementations utilizing the second and third echo pulses much more difficult to design and produce.

To address these deficiencies in the aforementioned non-differential and differential approaches, the features described herein may enable a differential delay-based clock without requiring multiple echo pulses. For instance, a differential delay (e.g., difference in time) between receipt of a feedthrough pulse and receipt of a first echo pulse may be used. The feedthrough pulse may be caused by a coupling between the transmit transducer and receive transducer of a BAW delay device. This feedthrough pulse may have a very short delay from the transmit pulse as well as a relatively flat delay slope over burst frequency (as compared to a second echo pulse after the first echo pulse). The feedthrough pulse is not an echo pulse, but is processed by the CMOS circuitry identically to the first echo pulse and experiences the same non-linear delay variations over temperature. Thus, both the feedthrough and first echo pulse may see the same delay variation over temperature and the differential measurement may cancel out the common non-linear variations over temperature caused by the CMOS elements of the BAW-based clock. Thus, the timing difference or differential delay may be defined by the difference between the receipt of the feedthrough pulse and the receipt of the first echo pulse. This may make the BAW delay-based clock described herein much simpler to design and produce than a differential approach using the first and second echo pulses or first and third echo pulses.

The features described herein may provide for a useful and effective BAW delay-based clock. While the BAW delay-based clock may have some inherent errors, the features described herein may account for such errors by normal operation of the BAW delay-based clock.

Example Systems

FIG. 1A illustrates examples of different objects in various environments. As shown on the left side image of the figure, there may be packages or equipment on a pallet in a warehouse. The pallet may have come off of a cargo truck as shown by the "In Transit" image in the middle of the figure. The pallet may be moved to one or more different locations within a warehouse, such as by the forklift shown in the left side image. The right-side image in the figure illustrates a situation where medical equipment (e.g., a wheelchair) and supplies in boxes may be stored in a supply room in a hospital.

In all of these situations—in the warehouse, on the cargo truck, or at the hospital, the objects of interest may move around. That may be to a different aisle or room in the warehouse, a different room (or even a different floor) of the hospital, or different part of the cargo container of the truck. In the latter case, the cargo may have shifted during transit or may have been repositioned as different packages were delivered to different locations. Knowing where the objects of interest are currently located, as opposed to where they are presumed to be based on an initial placement, is a valuable piece of information for an office manager, warehouse manager, nurse or orderly to have. Ideally, such people should be able to get the current location of a given object on their client computing device such as a laptop, mobile phone or smartwatch.

Figure 1B:
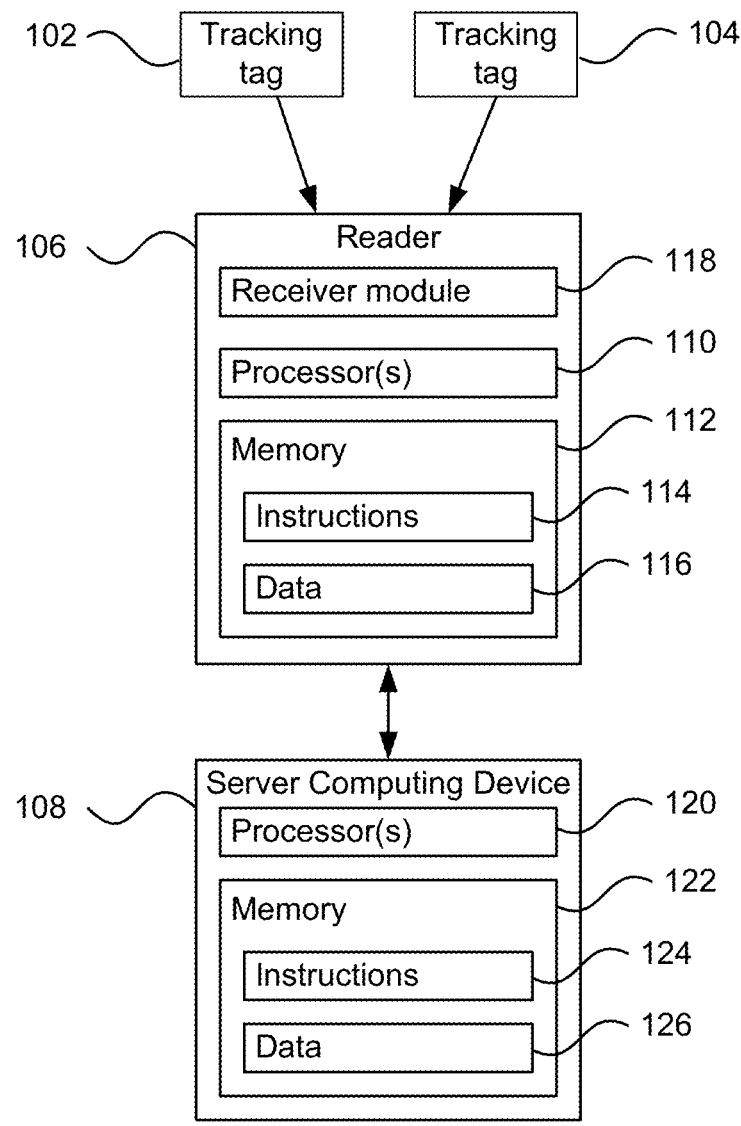
FIG. 1B is a functional diagram of an example tracking system in accordance with aspects of the disclosure.

FIG. 1B is a functional diagram of a tracking system 100. The tracking system 100 may include a plurality of tracking devices, such as tracking tags 102 and 104, and a reader 106. As discussed further below, one or more server computing devices 108 may also be part of the tracking system 100. A given tracking tag may be placed on or otherwise attached to or inserted into an object to be tracked, such as a package, a piece of equipment, a vehicle, a warehouse section, a room, etc. While tracking tags 102 may be associated with objects such as packages, equipment or vehicles (e.g., a forklift or an autonomous fulfillment robot that can retrieve packages from different locations in a warehouse), tracking tags 104 may be fixed to an aisle in a warehouse or from a specific room in a hospital. Thus, different tracking tags may be used depending upon customer needs. As an example, different customers may have varying accuracy and "liveliness" needs. For instance, one customer may only want to know aisle-level accuracy every day (e.g., before a warehouse closes for the evening), while another customer such as a hospital nurse may need to know which room a piece of equipment is in every hour so that it can be accessed should a patient need such equipment. Each tracking tag 102 or 104 may emit an informational signal, for example a beacon signal, via an antenna, such as using the transmitting device, to communicate data. In this regard, each tracking tag may include an identifier chip (such as for radiofrequency (RF) identification) and/or a transmitting device (such as an RF module configured to transmit beacon signals using a selected frequency band and transmission protocol). In this regard, the beacon signals may simply transmit identifying information in order to enable tracking of objects in the case of tracking tags discussed further below. To facilitate this, each tracking tag may be embedded with a unique identifier, such as a unique MAC address or BLUETOOTH identifier, which may function as a tracking tag identifier. This tracking tag identifier may be assigned to the tracking tag during the manufacturing or provisioning processes (described further below).

The transmitting device may send such information via radio frequency transmission in a selected frequency band, using a standard or proprietary protocol. By way of example, the transmitting device may employ a BLUETOOTH (e.g., a BLUETOOTH Low Energy (BLE)) or 802.11 protocol in the 2.4 GHz and/or 5 GHz frequency bands. In some examples, each beacon tracking tag and each tracking tag uses the BLUETOOTH or BLE protocol.

In some instances, the tracking tags may include one or more sensors. In such instances, the aforementioned communicated data may be formatted according to the selected protocol and include one or more sensed characteristics of the given tracking tag or its environment. For example, the sensed characteristic may be a temperature, a location, motion, battery conditions, trip conditions, and/or other detectable characteristics of the tracking devices or its environment.

The reader 106 may be a computing device configured to detect the beacon signals emitted by the plurality of tracking tags 102 and 104, then store and/or transmit data related to the tracking tags. While only one reader is shown in FIG. 1B, the system may employ multiple readers. The reader 106 may include one or more processors 110, memory 112 and other components typically present in general purpose computing devices. The reader 106 includes a receive module 118 having an antenna and a processing section (not shown), which may include a bandpass filter for the frequency band of interest, an analog to digital (A/D) converter, and a signal processing module to evaluate information in received beacon signals. The processing section may also convert the received beacon signal to a baseband signal, before or after A/D conversion.

The one or more processors 110 may be any conventional processors, such as commercially available CPUs or microcontrollers. Alternatively, the one or more processors may be a dedicated device such as an ASIC or other hardware-based processor, such as a field programmable gate array (FPGA). Although FIG. 1B functionally illustrates the one or more processors, memory, and other elements of the reader 106 as being within the same block, the processor, computing device, or memory may actually include multiple processors, computing devices, or memories that may or may not be stored within the same physical housing. For example, memory may be a hard drive, a removable USB drive or other storage media located in a housing different from that of the reader 106. Accordingly, references to a processor or computing device will be understood to include references to a collection of processors or computing devices or memories that may or may not operate in parallel.

The memory 112 stores information accessible by the one or more processors 110, including instructions 114 and data 116 that may be executed or otherwise used by the one or more processors 110. The data may include sensed characteristics from any of the tracking tags 102 and/or 104 received by the reader 106. The memory 112 may be of any type capable of storing information accessible by the one or more processors, including a computing device-readable medium, or other medium that stores data that may be read with the aid of an electronic device, such as a hard-drive, memory card, ROM, RAM, DVD or other optical disks, as well as other write-capable and read-only memories. Systems and methods may include different combinations of the foregoing, whereby different portions of the instructions and data are stored on different types of media.

The data 116 may be retrieved, stored or modified by the one or more processors 110 in accordance with the instructions 114. For instance, although the claimed subject matter is not limited by any particular data structure, the data may be stored in computing device registers, in a relational database as a table having a plurality of different fields and records, 8ML documents or flat files. The data may also be formatted in any computing device-readable format.

The instructions 114 may be any set of instructions to be executed directly (such as machine code) or indirectly (such as scripts) by the processor. For example, the instructions may be stored as computing device code on the computing device-readable medium. In that regard, the terms "instructions" and "programs" may be used interchangeably herein. The instructions may be stored in object code format for direct processing by the processor, or in any other computing device language including scripts or collections of independent source code modules that are interpreted on demand or compiled in advance. Functions, methods and routines of the instructions are explained in more detail below.

In some implementations, the tracking system 100 may further include a central server, such as one or more server computing devices 108 accessible by the one or more processors 110 of the reader 106. In some implementations, one or more tracking devices in the tracking system 100, such as a tracking tag 104, may be configured to obtain and communicate data directly to the one or more server computing devices 108. The one or more server computing devices 108 may include one or more processors 120, memory 122 and other components typically present in general purpose computing devices. The one or more processors 120 may be the same or similar type as the one or more processors 110, and the memory 122 may be the same or similar type as the memory 112. The memory 122 stores information accessible by the one or more processors 120, including instructions 124 and data 126 that may be executed or otherwise used by the one or more processors 120. Data 126 and instructions 124 may be the same or similar type as the data 116 and instructions 114, respectively.

After detecting the beacon signals of one or more tracking tags 102 or 104, the reader 106 may transmit the data from the tracking tags to the one or more server computing devices 108 through an existing connection or through a network. Thus, in this case the reader 106 may include a transmitter module (not shown) that is configured for wired or wireless transmission to the server computing device. The data may be received in a series of payloads (e.g., data packets) either continually, at one or more set intervals, or ad hoc whenever the tracking tags transmit. Thus, when there are multiple tracking tags, the data is effectively received as a plurality of separate data streams. A given payload (which may comprise one or more data packets) may include measurements taken at one or more time intervals, each of which may have a corresponding timestamp. In one scenario, the reader 106 may include a transceiver including both a receiver and a transmitter, which is configured to receive beacon signals from the tracking tags 102 and 104 and also to send and receive information with the server computing devices 108.

The one or more server computing devices 108 may be configured to track characteristics of the tracking devices for one or more alerts based on a plurality of conditions. The plurality of conditions may include at least one condition for each characteristic, such as a minimum, a maximum, a threshold, a duration, or a geofence. The conditions may be predetermined or set based on user input. For example, a first alert may be set for when (1) a temperature is greater than, e.g., 0° C. to 11° C. for 30 minutes and (2) the tracking device is on a trip, which may indicate overheating of a cooled package or storage compartment. A second alert may be set for when (1) no motion is detected for 11 minutes, (2) 2 of 3 locations are in a geofence, and (3) the tracking device is on a trip, which may indicate that a package is out for delivery. A third alert may be set for when (1) a threshold amount of light is detected from inside a package and (2) the tracking device is on a trip, which may indicate unexpected opening of the package or tampering. A fourth alert may be set for when (1) a threshold amount of light is detected from inside a package and (2) 2 of 3 locations are in a destination geofence, which may indicate opening of the package after delivery or receipt. Many other alert conditions and tracking scenarios are possible, and the above examples are not intended to be limiting.

The tracking system 100 may optionally include an application that may be installed on one or more client computing devices. Using the application, the client computing devices may access the data from the reader 106 and/or the server computing devices 108 through a network.

Figure 2:
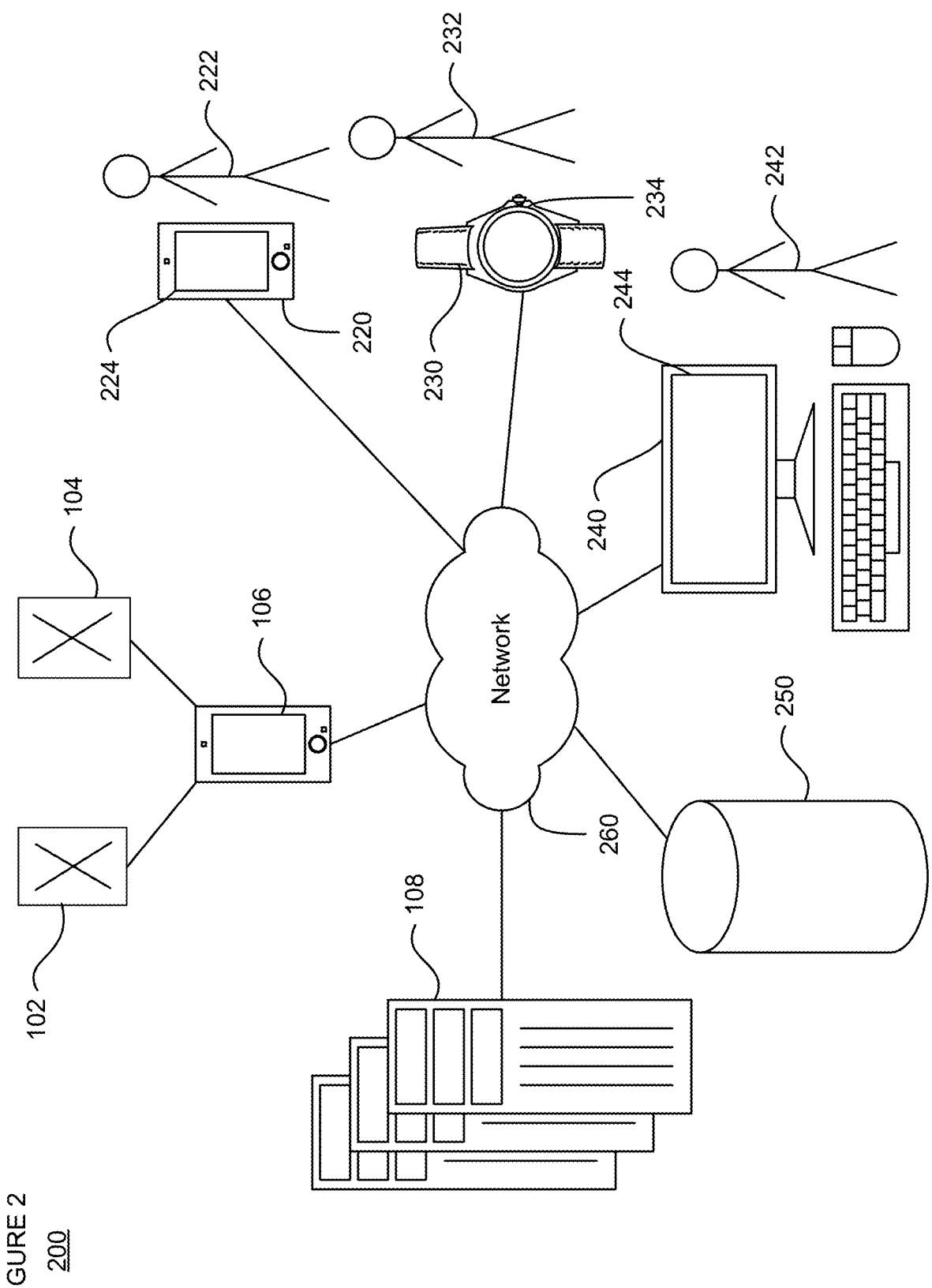
FIG. 2 is a pictorial diagram of an example network in accordance with aspects of the disclosure.
Figure 3:
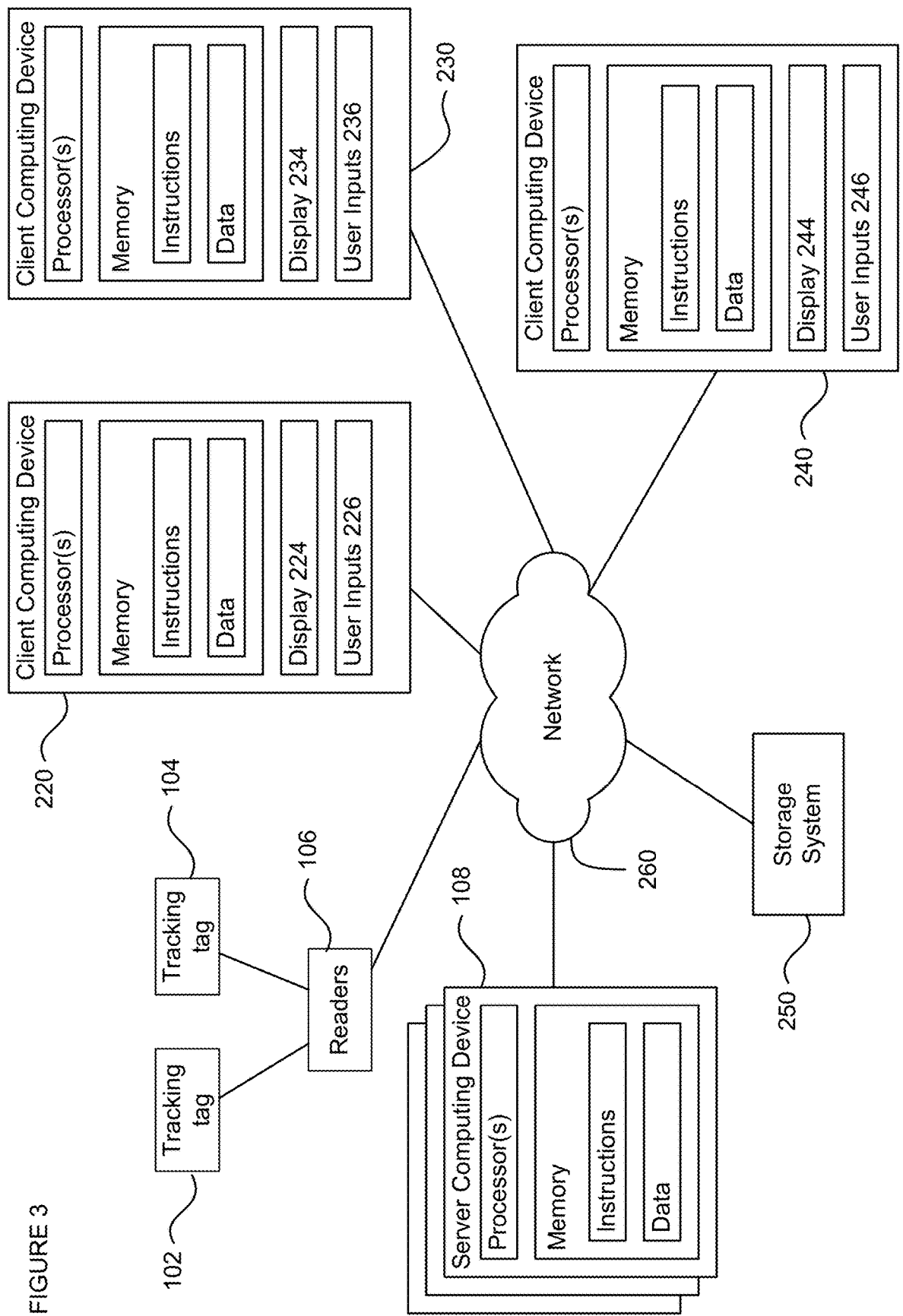
FIG. 3 is a functional diagram of the example network in FIG. 2 in accordance with aspects of the disclosure.

FIGS. 2 and 3 are pictorial and functional diagrams, respectively, of an example system 200 that includes a plurality of client computing devices 220, 230, 240 and a storage system 250 connected via a network 260. System 200 also includes tracking system 100, including tracking tags 102, 104, reader 106, and server computing device 108. Although only a few tags and computing devices are depicted for simplicity, a typical system may include significantly more.

The network 260, and intervening nodes, may include various configurations and protocols including short range communication protocols such as BLUETOOTH, BLUETOOTH LE, the Internet, World Wide Web, intranets, virtual private networks, wide area networks, local networks, private networks using communication protocols proprietary to one or more companies, Ethernet, WiFi and HTTP, and various combinations of the foregoing. Such communication may be facilitated by any device capable of transmitting data to and from other computing devices, such as modems and wireless interfaces.

Using the client computing devices, users, such as user 222, 232, 242, may view the location data on a display, such as displays 224, 234, 244 of respective client computing devices 220, 230, 240. As shown in FIG. 3, each client computing device 220, 230, 240 may be a personal computing device intended for use by a respective user and have all of the components normally used in connection with a personal computing device including a one or more processors (e.g., a central processing unit (CPU)), memory (e.g., RAM and internal hard drives) storing data and instructions, a display such as displays 224, 234, 244 (e.g., a monitor having a screen, a touch-screen, a head-mounted display, a smartwatch display, a projector, a television, or other device that is operable to display information), and user input devices 226, 236, 246 (e.g., one or more of a mouse, keyboard, touch screen and/or a microphone). The client computing devices may also include speakers, a network interface device, and all of the components used for connecting these elements to one another.

Although the client computing devices 220, 230, and 240 may each comprise a full-sized personal computing device, they may alternatively comprise mobile computing devices capable of wirelessly exchanging data with a server over a network such as the Internet. By way of example only, client computing device 220 may be a mobile phone or a device such as a wireless-enabled PDA, a tablet PC, a wearable computing device or system (e.g., a smartwatch or head-mounted display, or a netbook that is capable of obtaining information via the Internet or other networks. As an example, the user may input information using a small keyboard, a keypad, microphone, using visual signals (gestures) with a camera or other sensor, or a touch screen.

As with memory 112, storage system 250 can be of any type of computerized storage capable of storing information accessible by the one or more server computing devices 108, such as a hard-drive, memory card, ROM, RAM, DVD, CD-ROM, write-capable, and read-only memories. In addition, storage system 250 may include a distributed storage system where data is stored on a plurality of different storage devices which may be physically located at the same or different geographic locations. Storage system 250 may be connected to the computing devices via the network 260 as shown in FIG. 2, and/or may be directly connected to or incorporated into any of the client computing devices 220, 230, 240. The storage system 250 may store information about the tracking tags including, for example, location, status (e.g., activated and when), identifiers, last update, sensor data (e.g., temperature measurements), information about the object to which the tracking tag is attached (e.g., manufacturing data), and so on. In this regard, the information may be determined from received beacon signals provided to and updated at the storage system 250 by any of the one or more server computing devices 108 and/or client computing devices 220, 230, 240.

Figure 4A:
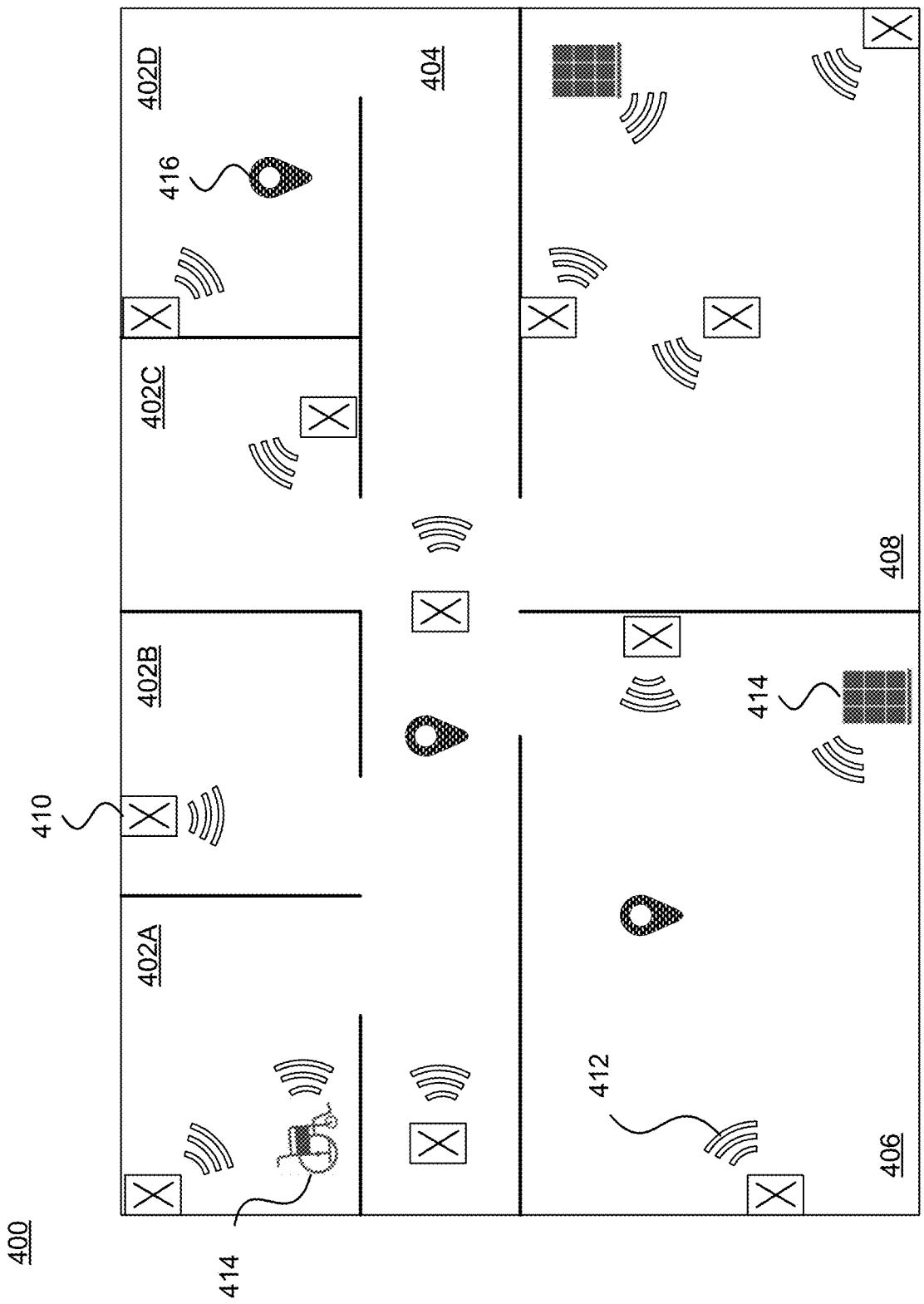
FIGS. 4A and 4B illustrate example scenarios in accordance with aspects of the disclosure.

FIG. 4A illustrates one example 400 of a system having a number of tracking tags arranged in various locations of a building (e.g., a hospital). In this example, there may be a number of rooms 402A, 402B, 402C, 402D, such as patient rooms, along one side of a hallway 404. On the opposite side of the hallway 404 there is a storage room 406, such as to house equipment or supplies, as well as another room 408, which may be a meeting room, common area, rehab facility or the like. One or more fixed tracking tags 410 corresponding to the tracking tags 102 or 104 may be located in each room, including the hallway. Each fixed tracking tag 410 is configured to emit beacon signals 412 (e.g., RF signals in a selected frequency band according to a particular communication protocol). While the beacon signals 412 may appear directional, this need not be the case and the beacon signals may be transmitted omnidirectionally, for instance from a tracking tag 410 that is located on the ceiling, pillar or floor.

In some implementations, the tracking tag 410 may be configured to emit beacon signals with information associated with its environment (e.g., temperature, humidity, etc.).

Tracking tags 414 may correspond to tracking tags 102 or 104 when placed on a variety of objects (e.g., a case of supplies as shown in storage room 406 or a wheelchair shown in room 402A). In some instances, the tracking tags may also be configured to emit beacon signals with information associated with the object on which the tracking tag is applied (e.g., temperature, motion information, object details, and/or other detectable characteristics of the tracking device or its environment). Readers 416 may be found at various locations in the building, such as in a patient room, the storage room, the hallway or other location. Note that even if transmitted omnidirectionally, the beacon signals from a given tracking tag may be attenuated in a non-uniform manner due to the presence of walls, furniture, floors/ceilings, equipment, etc.

Figure 4B:
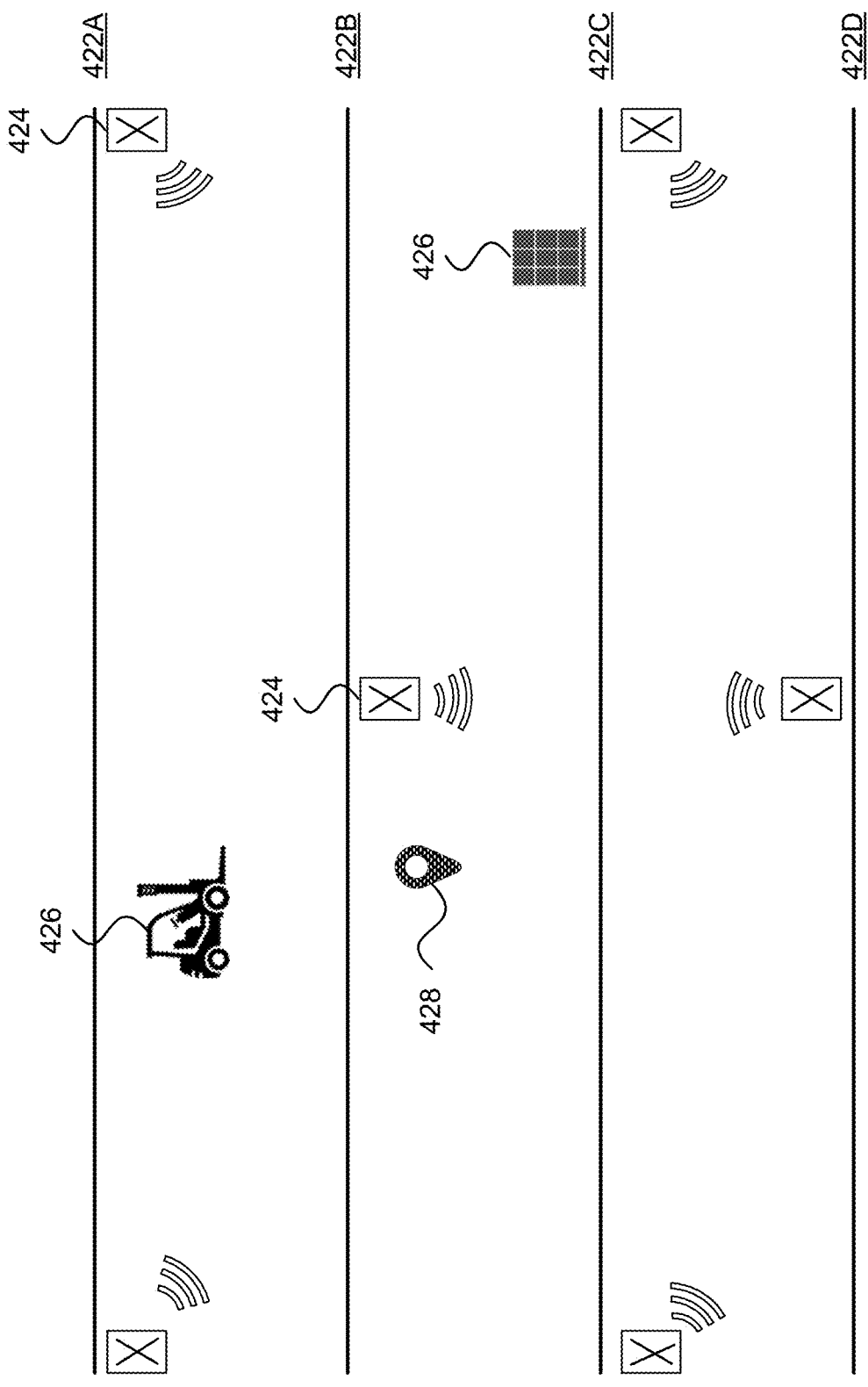

FIG. 4B illustrates another example 420 of a system having a number of fixed tracking tags positioned along different aisles in a warehouse setting. In this example, there are a number of aisles 422A, 422B, 422C, 422D, although there may be more (or fewer) aisles, and the aisles may be arranged in other configurations than what is shown. Here, fixed tracking tags 424 are located at different places for the aisles, such as along aisle end caps, along the ceiling (or floor), on shelves, storage lockers, cabinets or other places along the aisle, etc. Similar to FIG. 4A, fixed tracking tags 426 are placed on or otherwise associated with different objects, such as a pallet of equipment or a forklift that retrieves items from their locations in the warehouse. As above, the fixed tracking tags are configured to transmit beacon signals that are detectable by one or more readers 428.

In order to determine the location of a given tracking tag, the system may use signal strength information obtained from the beacon signals of one or more tracking tags. A series of beacon signals may be ramped at different power levels (a ramped sequence). Evaluating the received beacon signals in view of their transmitted power can enable the system to determine which room or other location at which a given tracking tag is located. From that, the system is able to determine a location for a given tracking tag (and thus its corresponding object) with a suitable degree of certainty, such as by triangulating its position relative to the relevant tracking tags.

In order to enable the use of the aforementioned tracking tags on as many different types of objects and locations as possible, the tracking tags may be designed to be both thin and flexible. In addition, each tracking tag may be passive, such as a tracking tag configured to activate or be powered by environmental energy, or active, configured to include a battery or be coupled to another power source. In the case of a battery, delaying activation of the battery until the end user is ready to use the tracking tag is critical to extending the useful life of the tracking tag.

In order to enable the use of the aforementioned tracking tags on as many different types of articles to be shipped and other objects as possible, the tracking tags may be designed to be both thin and flexible. In this regard, the tracking tags may be configured as adhesive shipping labels (e.g., 4×6 shipping labels commonly used by logistics companies to ship packages such as envelopes, boxes, bags, etc.).

Figure 5A:
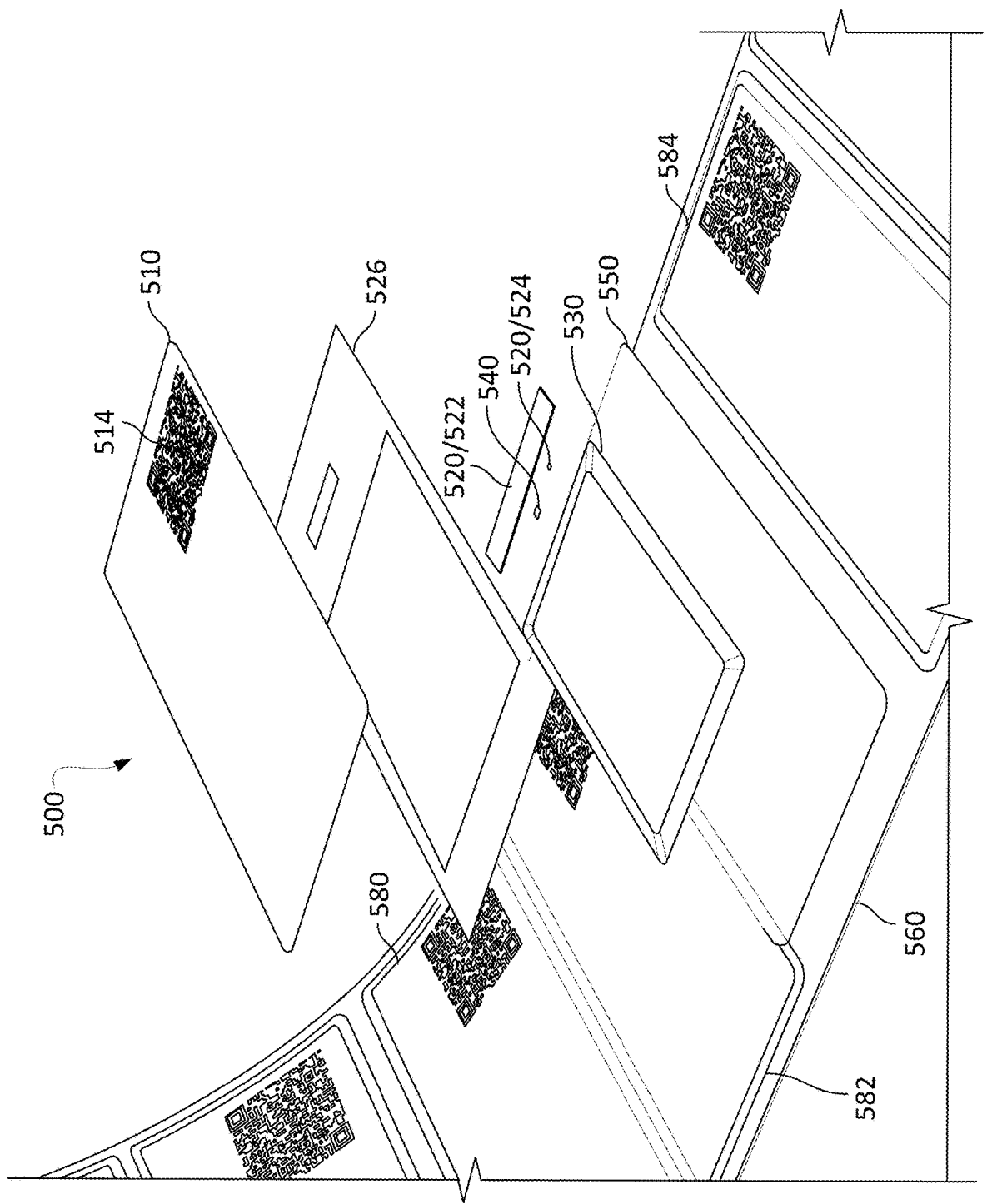
FIGS. 5A and 5B are example views of tracking tags in accordance with aspects of the disclosure.

Each tracking tag may include various components such as a top layer for printing a label, a frame, beacon transmission circuitry, a bottom layer including an adhesive (for attaching the tracking tag to an article to be shipped or another object). FIG. 5A is an example top-down, view of a plurality of tracking tags 500, 580, 582, 584 which may be configured the same as or similarly to any of the tracking tags 102, 104, 410, 414 described above. In this example, the tracking tag 500 is depicted in an exploded view and includes a top layer 510, beacon transmission circuitry 520, one or more batteries 530, a processor 540, and a bottom layer 550 below the top layer and beacon transmission circuitry. Tracking tags 580, 582, 584 may be configured the same or similarly to tracking tag 500.

The tracking tag 500, as with the tracking tags described above, may also include beacon transmission circuitry 520. In this example, the beacon transmission circuitry includes an antenna 522 and capacitor 524 which may be arranged on a flex inlay 526.

The top and bottom layers may provide impact protection, prevent the ingress of liquids and other contaminants, as well as provide a smooth surface for applying labels or on which to print information (whether or not an additional adhesive label is not used). The top layer 510 and bottom layer 550 may be a thin sheet (e.g., 0.1 mm) of polyester or paper each with an adhesive backing. In this regard, the top layer 510 may be pressed onto the bottom layer 550 with the beacon transmission circuitry 520, one or more batteries 530, and the processor 540 (and in some instances, a frame or flex inlay 526 as discussed further below) therebetween. In this regard, the beacon transmission circuitry 520, one or more batteries 530, and processor 540 are arranged between the top layer and the bottom layer. In addition, the adhesive backing on the top layer may secure the top layer to the bottom layer, and the adhesive backing on the bottom layer may be used to attach the tracking tag to an object (e.g., a package). Alternatively, the bottom layer may include adhesive on opposing sides (e.g., a top side and a bottom side) of the bottom layer allowing for the attachment of the top layer onto the bottom layer without the additional adhesive. As noted above, the adhesive backing may include commercially available glues or double-sided tapes such as those provided by 3M including 3M Double Coated Tape 93015LE.

The top layer 510 may be configured to be printed on during manufacturing and/or by the end user before application of the tracking tag on an object (e.g., a package, a wall, a shelf, etc.). For example, the end user may be able to print tracking and identifier information directly onto the top layer. As such, top layer 510 may be a top adhesive label with a pre-printed visual code 514. For instance, the tracking tag 500 may have a visual code such as QR codes or barcodes printed on the tracking tag or may include a passive RFID or a no power NFC chip, etc. which can be read by the input devices (e.g., a scanner). Alternatively, the tracking and identifier information may be printed onto a separate label and applied to a surface (e.g., the top layer) of the tracking tag 500 when ready to use the tracking tag. Such labels may include proprietary labels or commercially available labels such as those provided by AVERY including the Avery Ultra Duty White Film 94211.

The beacon transmission circuitry 520 may be situated at least partially within the flex inlay 526 or a printed circuit board (PCB) (not shown) and may be connected to the one or more batteries 530 via traces. The PCB may include various features such as an identifier chip and/or a transmission device for the purposes of transmitting beacon signals. The PCB may be a commercially available PCB which can be connected to one or more batteries. For example, the PCB may include PCBs such as surface mount technology (SMT) PCBs including devices that enable BLUETOOTH LE 4.0 technology for the purposes of enabling the aforementioned beacon signals.

Figure 6B:
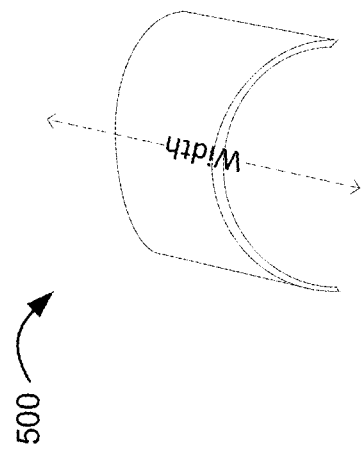
FIGS. 6A and 6B are example views of tracking tags in accordance with aspects of the disclosure.
Figure 6A:
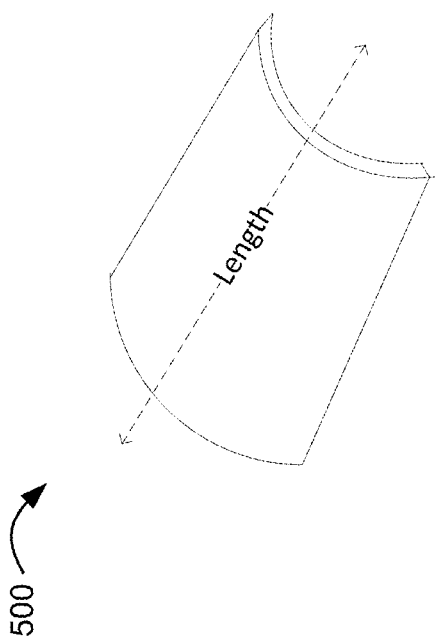

The one or more batteries 530 may be relatively thin. For example, the one or more batteries 530 may include a coin cell, prismatic, pouch, thin-film, or screen-printed battery. For example, as depicted in FIG. 5A, the one or more batteries 530 is a thin film battery. In this example, the thin film battery may be a commercially available thin-film MOLEX 13299-0002 battery, CPO042350 battery provided by RENATA BATTERIES, etc. In this regard, given the configuration of the tracking tag 500, this may allow for bending along the length of the tracking tag 500 as depicted in FIG. 6A as well as along the width of the tracking tag 500 as depicted in FIG. 6B.

Alternatively, coin cell batteries, such as CR2016, CR1216, CR1220, CR2012, etc. may be used. Coin cell batteries are typically used in powered badges and key cards and provided various benefits such as improved safety (e.g., because of a metal encased battery with reduced puncture danger as compared to thin-film batteries), higher capacity or rather longer life for extended runtime operations, lower costs, easier storage (for example, coin cell batteries usually slot into a battery holder and thus can be stored separately and installed closer to time of use which may also allow tracking tags to be stored in facilities not rated for battery storage whereas flatpack or other custom batteries are typically bonded to the device at manufacturing), lower lead times (e.g., for manufacture and availability), and so on.

In addition, although coin cell batteries do not bend, their smaller form factor may allow for lower stiffness in the tracking tag. In other words, the tracking tag may be more tolerant to bending at points away from the coin cell battery whereas for a thin-film battery, bending should be avoided in order to prevent damage to the thin-film battery which may have a larger form factor. The further the rigid portions are located away from one another and the PCB, the greater the amount of flexibility that can be achieved. In this regard, given the configuration of the tracking tag 500, bending along the length of the tracking tag 500 as depicted in FIG. 6A may be less desirable (e.g., likely to cause damage to the rigid components) than bending along the width of the tracking tag 500 as depicted in FIG. 6B.

The processor 540 may be configured the same or similarly to processors 110 and may include conventional processors, such as commercially available CPUs, MCUs, etc. For instance, the processor 540 may also include BLUETOOTH radio capabilities such as the NORDIC SEMICONDUCTOR nRF52832 or INPLAY IN100. In some instances, the processor 540 may actually comprise multiple processors that may or may not be stored within the same physical housing.

In some instances, as an alternative to the flex inlay, the tracking tag may include a frame (not shown) to provide additional support to the tracking tag. For example, the frame may be formed from various materials such as polycarbonates or other plastics such as cellulose fiber (paper/wood), polyethylene (PE/LDPE/HDPE), polypropylene (PP), Vinyl (PVC), Nylon, Polyurethane (foam), rubber, silicone, resin, carbon fiber. The frame may be die-cut, molded or manufactured using other processes. The materials of the frame may be selected in order to enable the frame to be strong and puncture resistant while also flexible. In this regard, the frame may enable the tracking tag 500 to be attachable to objects (via the adhesive of the bottom layer 550) of various shapes including curved surfaces, such as depicted in FIGS. 6A and 6B.

Figure 5B:
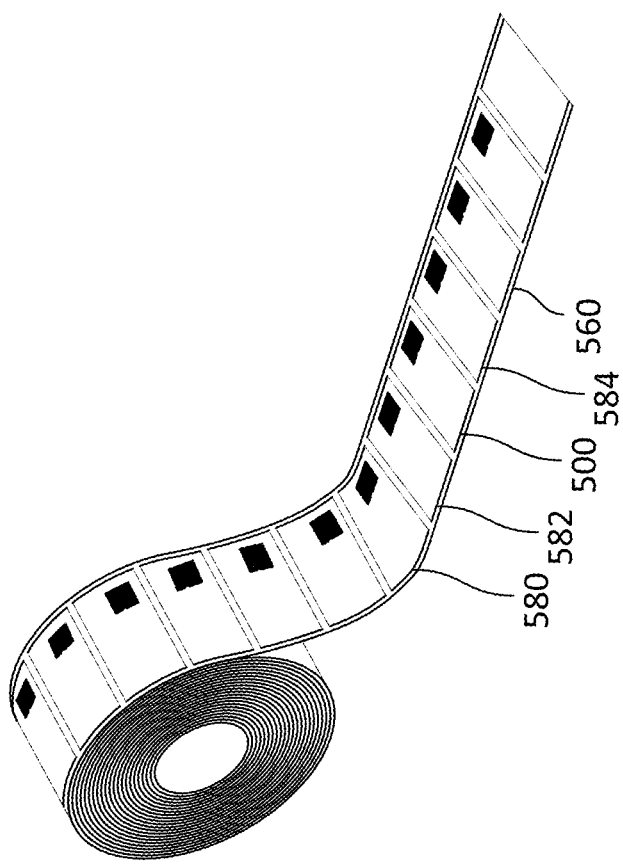

In some instances, a liner sheet or liner material, such as liner material 560 of FIGS. 5A, 5B, may be used to protect the adhesive before the tracking tag is attached to an object. The liner material 560 may allow adhering multiple labels to the liner material during manufacturing and may be either rolled or folded into one continuous strip of labels to feed into a printer. For instance, before using the tracking tag 500 may be attached to the liner material 560 such as craft or other paper to protect the adhesive on the bottom layer of the bottom surface before use. In such instances, the tracking tags may be provided on a roll which can be run through a printer to enable printing of information on the top layer of the tracking tags. In this regard, the tracking tags 500, 580, 582, 584 of FIG. 5A may represent a small portion of a larger roll which has been unrolled. Thus, a plurality of the tracking tags may be manufactured on a roll of the liner material 560, such as a waxed paper liner or other appropriate backing, which allows the tracking tags to be printed.

When in use, each tracking tag may be peeled off of the roll of liner material and applied to an article to be shipped or another object by a human operator. In this regard, before applying the tracking tag 500 to an object, the tracking tag may be removed from the liner material (e.g., peeled away) in order to expose the adhesive on the bottom surface of the bottom layer. As noted above, the tracking may be printed on during manufacturing and/or by a human operator before removal from the liner material application of the tracking tag on a package to be shipped or another object. Thereafter the tracking tag 500 may be activated (in order to initiate the bacon signals) in a normal operating mode for tracking objects as described above and attached to an object for tracking purposes.

In addition to the normal operating mode, as discussed further below, each tracking tag may have a sleep or dormant mode. For instance, when in the sleep or dormant mode, the tracking tag may be disabled "sleep mode" by defaulting to a chip-enabling pin being disabled. When the tracking tags are ready to be used, a circuit loop may be broken which enables the chip-enabling pin and activates the tracking tag in the normal operation mode so the tracking tag sends beacon signals.

Figure 7:
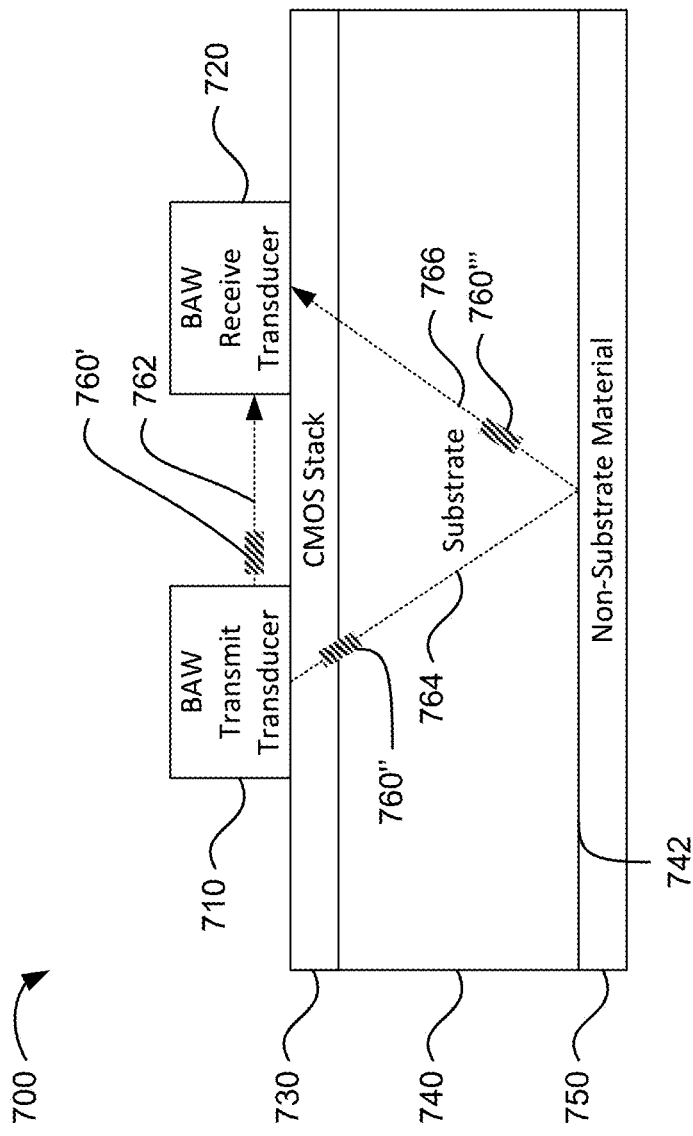
FIG. 7 is an example representation of a cross-sectional view of a bulk acoustic wave device in accordance with aspects of the disclosure.

The beacon transmission circuitry 520 may include a BAW delay-based clock. FIG. 7 is an example representation of a cross-sectional view of a BAW delay device. In this example, a BAW delay device (or ultrasonic delay device) may be implemented as a monolithic device which includes a BAW transmit transducer 710 and a BAW receive transducer 720 which may be realized (e.g., implemented) using a micro-electromechanical system (MEMS) stack, complementary metal-oxide semiconductor (CMOS) stack 730, and a substrate 740. The BAW transmit transducer 710 and the BAW receive transducer 720 are arranged above and/or may be fabricated on the CMOS stack 730.

The CMOS stack 730 may include a plurality of layers (e.g., 25, 33, 25 layers or more or less) and may include an SiO2 insulation/passivation layer on top. As shown, the CMOS stack 730 is arranged at least partially between the substrate and the BAW. The MEMS stack (not shown) may be arranged on the CMOS stack (e.g., above the SiO2 insulation/passivation layer) and may include a plurality of layers (e.g., 4, 6, 7 layers or more or less). For example, the MEMS layers may include a first (e.g., bottom) layer of Titanium/Molybdenum (TiMo) metal, an intermediate layer including a piezoelectric material such as Aluminum Nitride (AlN) or Aluminum Scandium Nitride (AlScN), and a third layer of TiMo metal with an additional a passivation layer of either SiO2 or Silicon nitride (SiN). The BAW transmit transducer 710 and a BAW receive transducer 720 may be arranged within one or more layers of the MEMS stack in order to facilitate the oscillation of the intermediate layer of the piezoelectric material.

The CMOS and MEMS stacks may be positioned on a substrate 740 which may include materials such as silicon (e.g., SiO2). Vias through the CMOS stack may allow for electrical contact between the CMOS stack, MEMs layers, and the substrate. Below the substrate is a material other than the substrate (non-substrate material 750) which may include air or a non-soluble protective coating.

In this example, the BAW transmit transducer 710 may generate a pulse of ultrasonic waves or burst pulse 760. Given the coupling and proximity of the BAW transmit transducer 710 and the BAW receive transducer 720, a portion or feedthrough pulse 760' of the burst pulse 760 will travel along path 762 and be received by the BAW receive transducer 720 almost immediately (e.g., on the order of 1 nanosecond) of when the burst pulse was generated. Another portion 760" of the burst pulse 760 travels down along path 764 through the CMOS stack 730 as well as the substrate 740. When the portion 760" of the burst pulse 760 reaches an edge or boundary 742 of the substrate 740, a difference in acoustic impedance between the substrate and the non-substrate material 750 may cause some part of the portion 760" of the burst pulse 760 to be reflected off of the edge and back towards the BAW receive transducer 710 device along path 766. The portion 760''' of the burst pulse 760 that is received at the BAW receive transducer 710 is referred to as an echo pulse. Because the feedthrough pulse 760' is not reflected off of the edge 742, the feedthrough pulse is not an echo pulse. Subsequent portions, smaller amplitude echo pulses of the burst pulse 760 may continue to be reflected back and forth through the substrate and received by the BAW receiver. These subsequently received portions of the burst pulse are referred to as a second echo pulse, third echo pulse, and so on.

Figure 8:
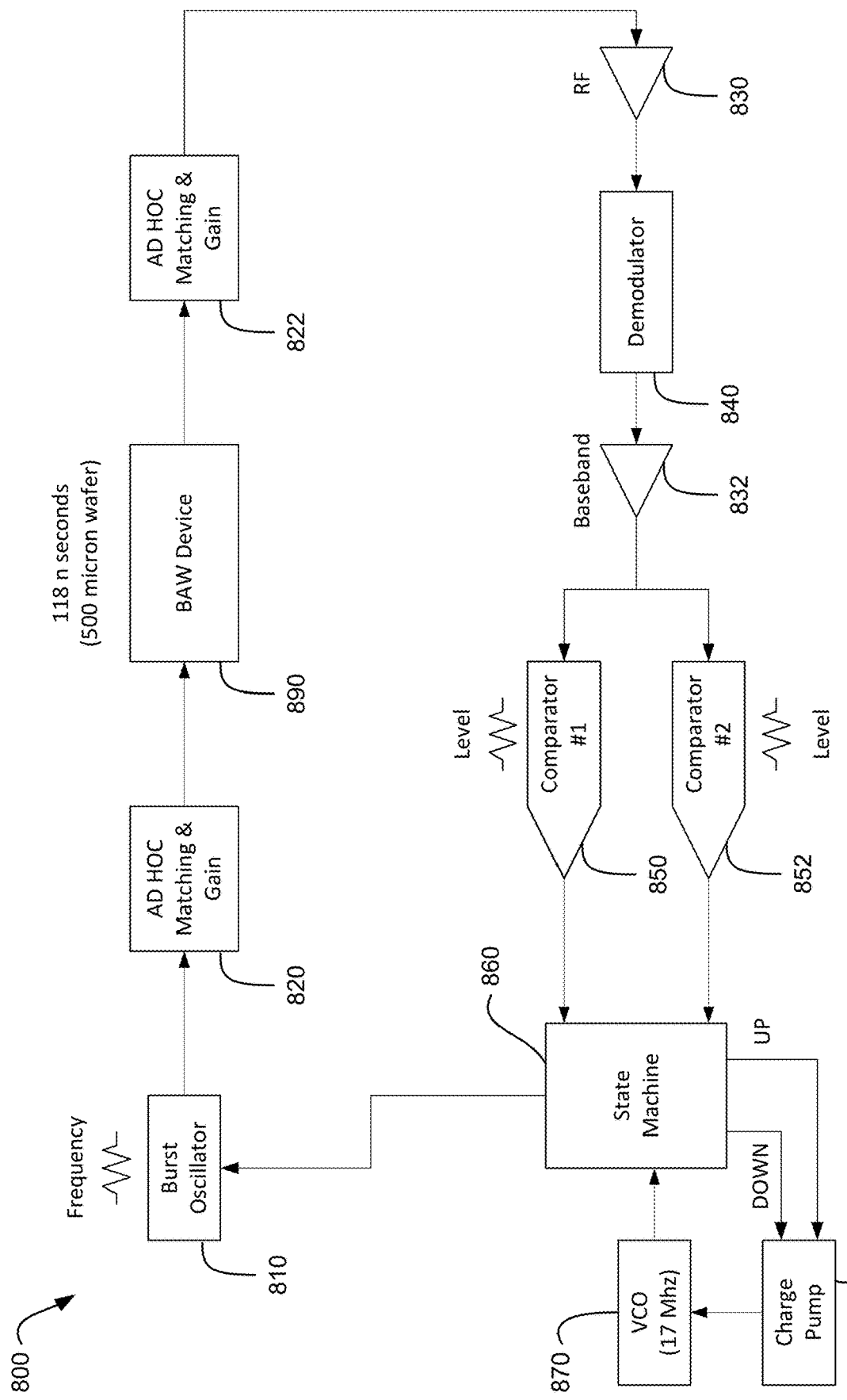
FIG. 8 is an example representation of a system in which a bulk acoustic wave device may be implemented in accordance with aspects of the disclosure.

FIG. 8 represents a system 800 in which the BAW delay device 700 may be incorporated (e.g., implemented). In this example, the system 800 may be a BAW delay-based clock implemented as a "loop" or a logical or feedback loop. In this example, the BAW-delay based clock includes various features such as a burst oscillator 810, radio frequency (RF) amplifiers 820, 822, and 830, baseband amplifiers 832, a demodulator 840, comparators 850, 852, a state machine 860, a voltage-controlled oscillator (VCO) 870, a charge pump 880, and a BAW delay device 890. In this regard, the BAW delay device 890 may be configured the same or similarly to the BAW delay device 700, and thus may include the BAW transmit transducer 710 and BAW receive transducer 720 and other features of FIG. 7 described above.

The burst oscillator 810 may be configured to generate a burst pulse of microwave energy which, when delivered to the piezoelectric material (of the intermediate layer of the MEMS stack) which includes the BAW transmit transducer 710 of the BAW delay device 890, creates the ultrasonic pulse or burst pulse (such as the burst pulse 760 described above). For example, the BAW delay device 890 may include a piezoelectric material that oscillates when a voltage is applied. In some instances, the burst oscillator may generate a burst pulse with a duration which may range between 5 and 40 nanoseconds or more or less.

The RF amplifiers 820, 822 may enable impedance matching and gain processes. This may allow the amplifiers to match the burst oscillator impedance to the piezoelectric transducer impedance and remove reflections between the output of the burst oscillator and input to the BAW transmit transducer 710 as well as between the output of the BAW receive transducer 720 and the input to the demodulator. This, in turn, may enable the system to maximize power from a pulse (e.g., ultrasonic waves that are input into the amplifiers) as the pulse enters and exits the BAW delay device 890.

Additional RF and baseband amplifiers 830, 832 may also be used to process signals into and out of a demodulator 840. The demodulator 840 may function as a rectifier which removes all but the positive portion of an input signal. As a result, the comparators may be better able to detect the rising edge of each burst pulse.

At different points in time, the BAW receive transducer 720 may output the feedthrough pulse or an echo pulse into the RF amplifier 830. As such, either the feedthrough pulse or the first echo pulse may pass through each of the comparators 850, 852. Each comparator may be configured to use a different threshold. For example, comparator 850 may use a threshold set for the feedthrough pulse while comparator 852 may use a threshold set for the first echo. Comparator 850 may be enabled for a time window centered on the expected time of the feedthrough pulse, and comparator 852 may be enabled during a time window centered on the expected time of the first echo.

Outputs from both comparators are input into the state machine 860. The state machine may be configured to periodically align the cycle of the VCO 870 to the feedthrough pulse and the first echo pulse. Periodically may mean one out of four cycles, one out of eight cycles, one out of sixteen cycles of the VCO, etc. as determined by the state machine. For instance, each time the comparators send input into the state machine, the state machine may generate up and down signals to a charge pump. The charge pump 880 may send a signal to the VCO 870. For instance, the charge pump 880 may use the signals from the state machine 860 to increase or decrease voltage to the VCO 870 (thereby changing the frequency of the VCO).

The VCO 870 may be an electronic oscillator whose output frequency is proportional to its input voltage. For example, the VCO 870 may include a relaxation oscillator or an LC oscillator. As an example, VCO 870 may generate a nominal output frequency of 16 MHz or 1.6 GHz. If the input to the VCO 870 remains constant, the output of the VCO may stay at a particular frequency. The state machine 860 may thus be configured to lock the time difference between the receipt of the feedthrough pulse and the receipt of the first echo pulse to one or more cycles of the VCO. If the time difference between the feedthrough pulse and the first echo pulse is smaller than two periods of the VCO, the state machine may increase the frequency of the VCO. If the time difference is more than two periods of the VCO, the state machine 860 may send a signal to the VCO to decrease the frequency of the VCO. In this way, the transition edges of the VCO may be time-wise aligned with the feedthrough and first echo pulses in the BAW delay device 890.

To avoid interference from prior echo pulses, the burst oscillator may generate the burst pulse only once for every eight or sixteen cycles of the VCO 870. An example using the eight cycle mode may operate as follows. After triggering the burst pulse, the first two cycles of the VCO may be used to process the feedthrough and the first echo pulse. The next six cycles from the VCO may be ignored to allow the higher order echo pulses such as the second, third, and fourth echo pulses to propagate and reduce in amplitude until interference caused by the subsequent echo pulses may be small enough to be insignificant or have little to no effect on the BAW delay based clock. The next burst pulse may then be generated at the end of the eighth cycle of the VCO and the process repeats until the circuit is turned off.

Figure 9:
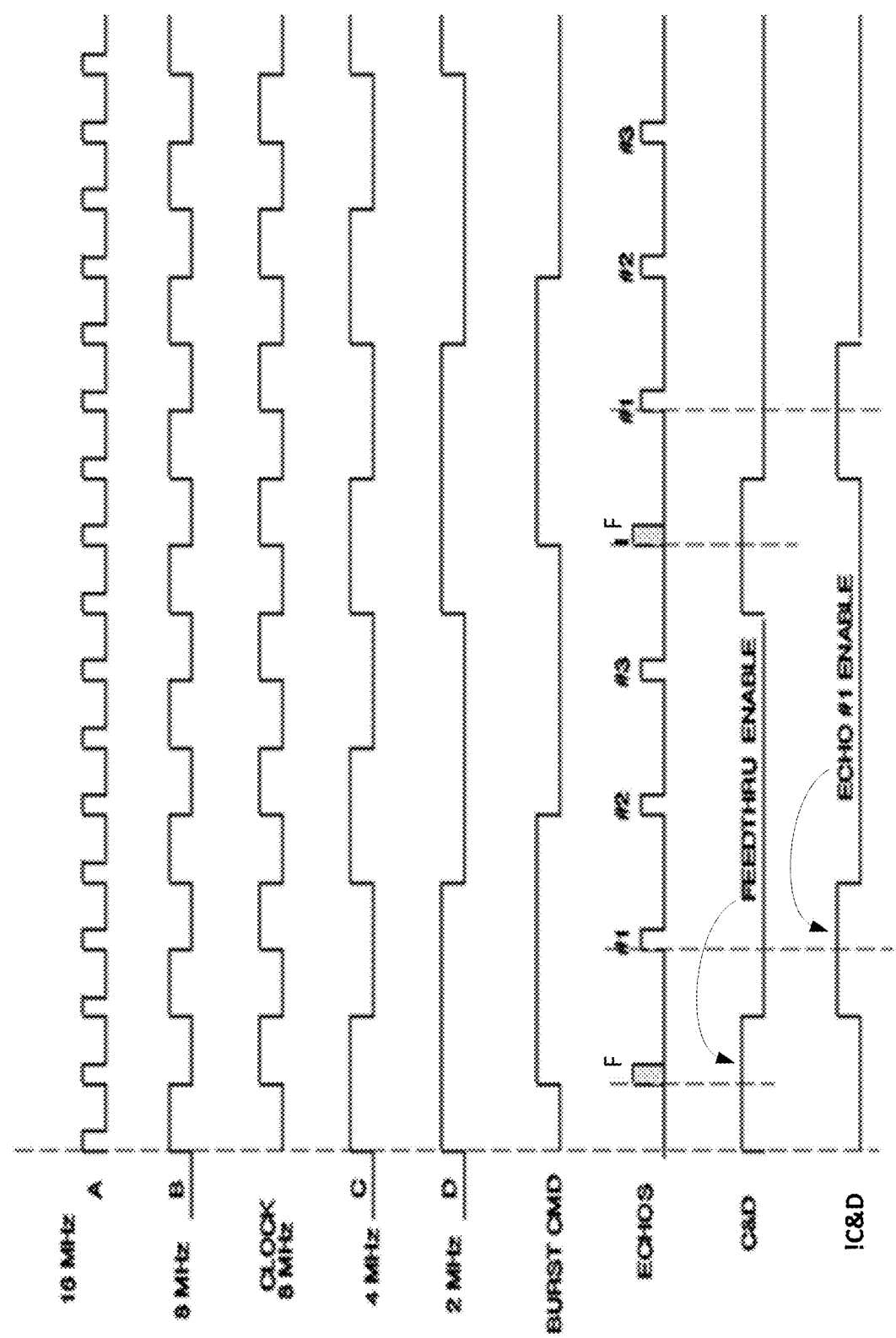
FIG. 9 provides an example comparative representation of various information and signals in accordance with aspects of the disclosure.

FIG. 9 provides an example comparative representation of various information and signals which may be used in the system 800. In this example, the representations correspond to the timing of at least a first burst pulse and a second burst pulse (e.g., at least 16 cycles of the VCO 870). For instance, the A line represents a 16 MHz clock, corresponding to the frequency of the VCO 870. In some instances, the 16 MHz clock may have a duty cycle which is not exactly 50%. The B line represents an 8 MHz clock which is derived from the 16 MHz clock but will have a 50% duty cycle. The C and D lines represent 4 and 2 MHz clocks, respectively. Each of the B line, C line, and D line may be determined by the system by dividing down on the timing of the A line. In this regard, the BAW delay-based clock described herein may be used to generate an 8 MHz clock, a 4 MHz clock, or a 2 MHz clock. The rising edges of the BURST CMD signal controls the timing of the burst pulses. As described above, each burst pulse may result from the burst pulses of microwave energy generated by the burst oscillator 810 and lasts, in this example, for 20 nanoseconds. The ECHOS line represents the approximate timing of the feedthrough pulse (F) (which, as noted above, is not an echo), as well as the first (#1), second (#2) and third (#3) ccho pulses.

The C&D and !C&D lines of FIG. 9 are related in that !C&D is high when C is low and D is high. The C&D line represents the window of time during which the feedthrough pulse is expected to be received. The !C&D line represents the window of time during which the first echo pulse is expected to be received. The window of time when the C&D enable window is high straddles the expected arrival time of the first echo pulse and allows for errors during the startup phase and prior to locking the VCO cycle periods to the BAW delay timing. The C&D signal provides a similar window for the feedthrough pulsc. When the BAW-delay based clock is locked, both the feedthrough and the first echo pulse will arrive right in the middle of the time windows provided by C&D and !C&D. Both the !C&D and C&D signals are low during the times when the 2nd and 3rd echo pulses are received, thereby rejecting interference from these echo pulses.

Figure 10:
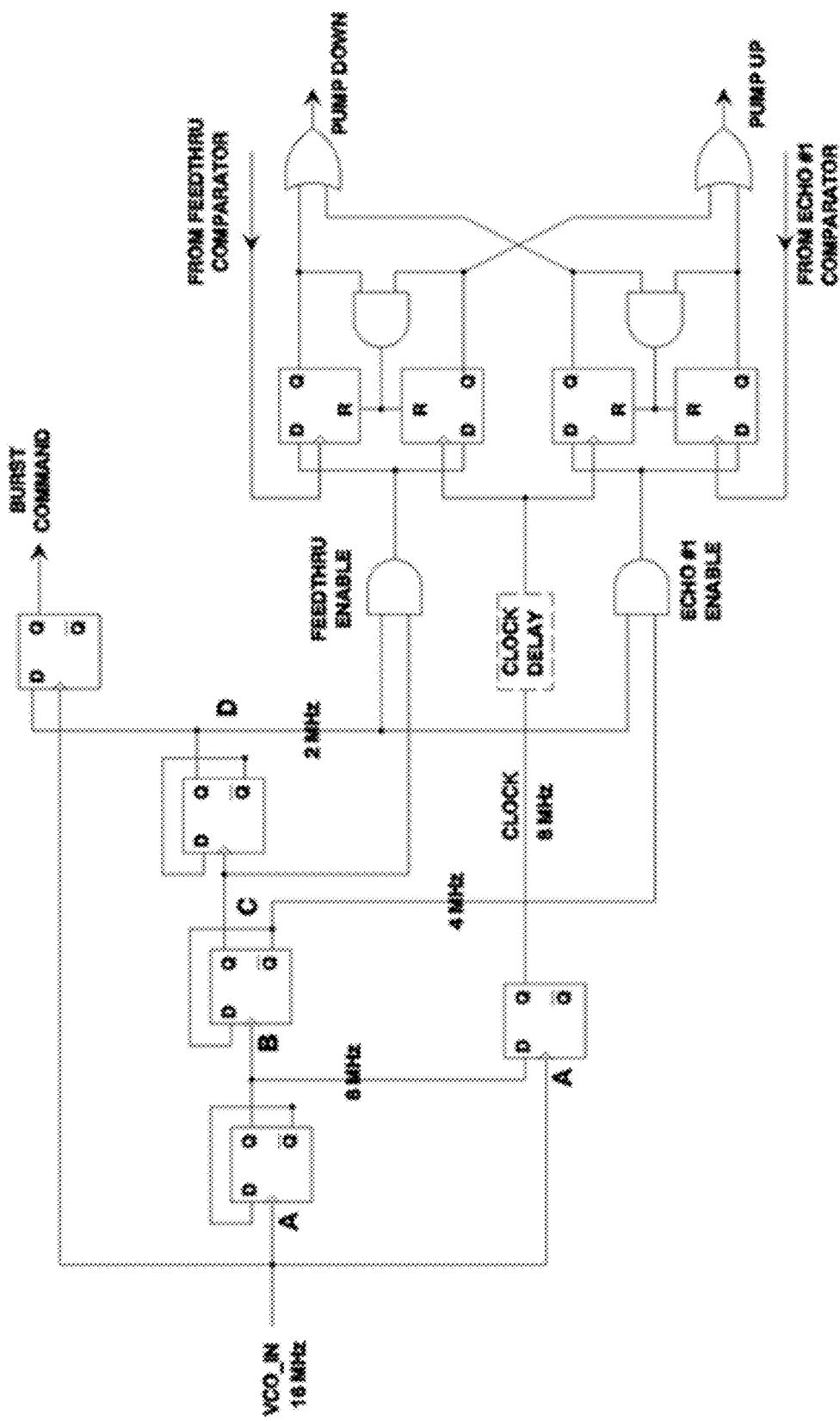
FIG. 10 is an example logical schematic of a state machine in accordance with aspects of the disclosure.

FIG. 10 provides a logical schematic of the state machine 860 to produce the signal timings shown in FIG. 9. The input is the 16 MHZ VCO clock, and the state machine divides the 16 MHz clock to produce the 8 MHZ, 4 MHZ, and 2 MHz clocks. The two AND gates combine the appropriate signals to create the enable windows for the feedthrough and Echo #1 pulses. The remaining blocks on the right side of FIG. 10 accept the feedthrough and Echo #1 signals during the appropriate windows to create the PUMP UP and PUMP DOWN pulses to the charge pump (e.g., charge pump 880). Connecting these signals via the charge pump to the VCO implements a negative feedback loop which 'locks' the VCO's period to the time difference between the feedthrough and first echo pulses. During initial acquisition the PUMP UP and PUMP DOWN signals will vary in width until the BAW-based clock is locked. One of the PUMP UP or PUMP DOWN signals will be wider than the other in order to drive the VCO frequency up or down toward an ultimate frequency lock. Once the BAW-based clock is locked, the PUMP UP and PUMP DOWN pulses will be equal and as narrow as possible and only widening as necessary to keep the BAW-based clock locked on the timing difference between receipt of the feedthrough pulse and receipt of the first echo pulsc.

Figure 11:
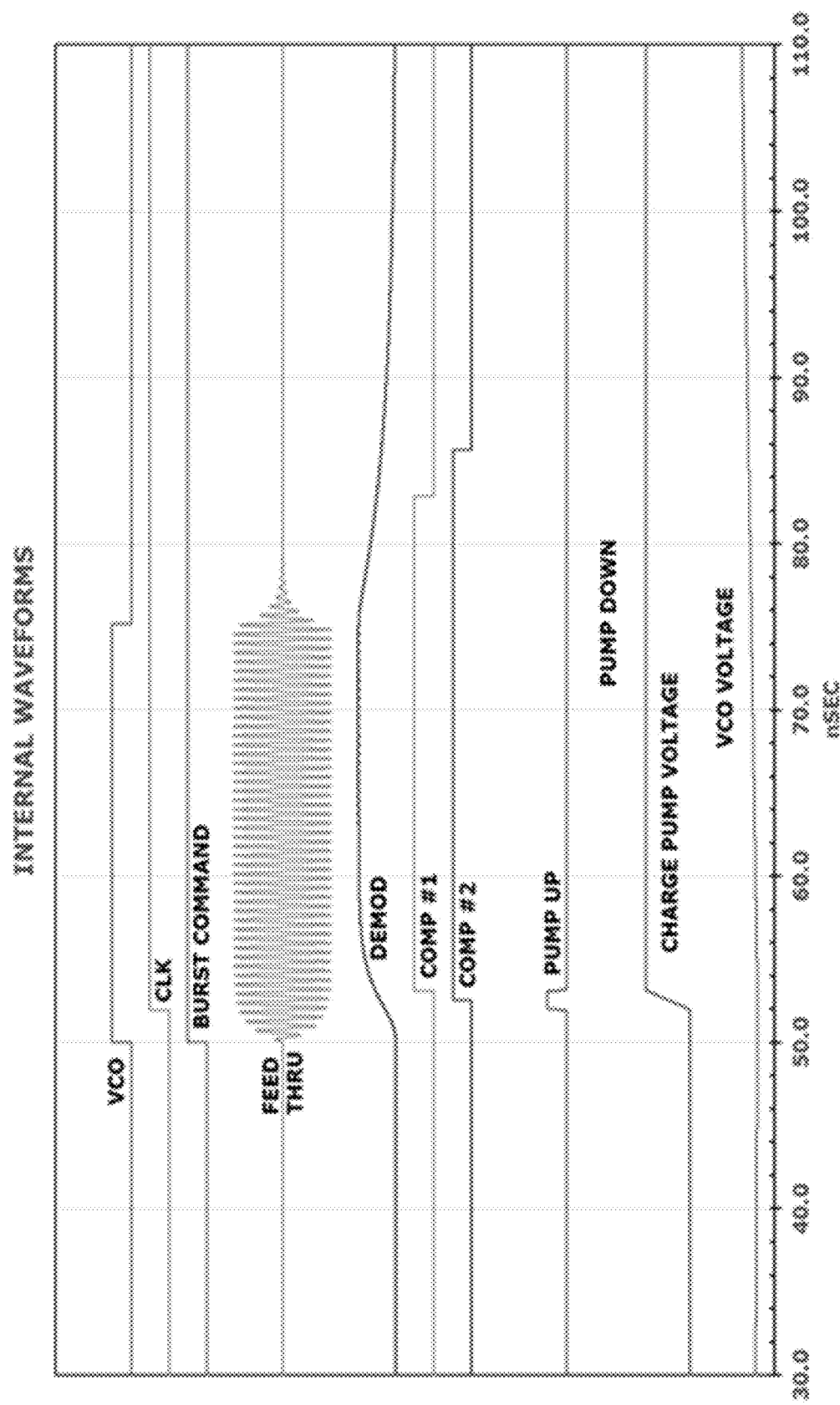
FIGS. 11, 12, 13, and 14 provide representations of waveforms in accordance with aspects of the disclosure.
Figure 12:
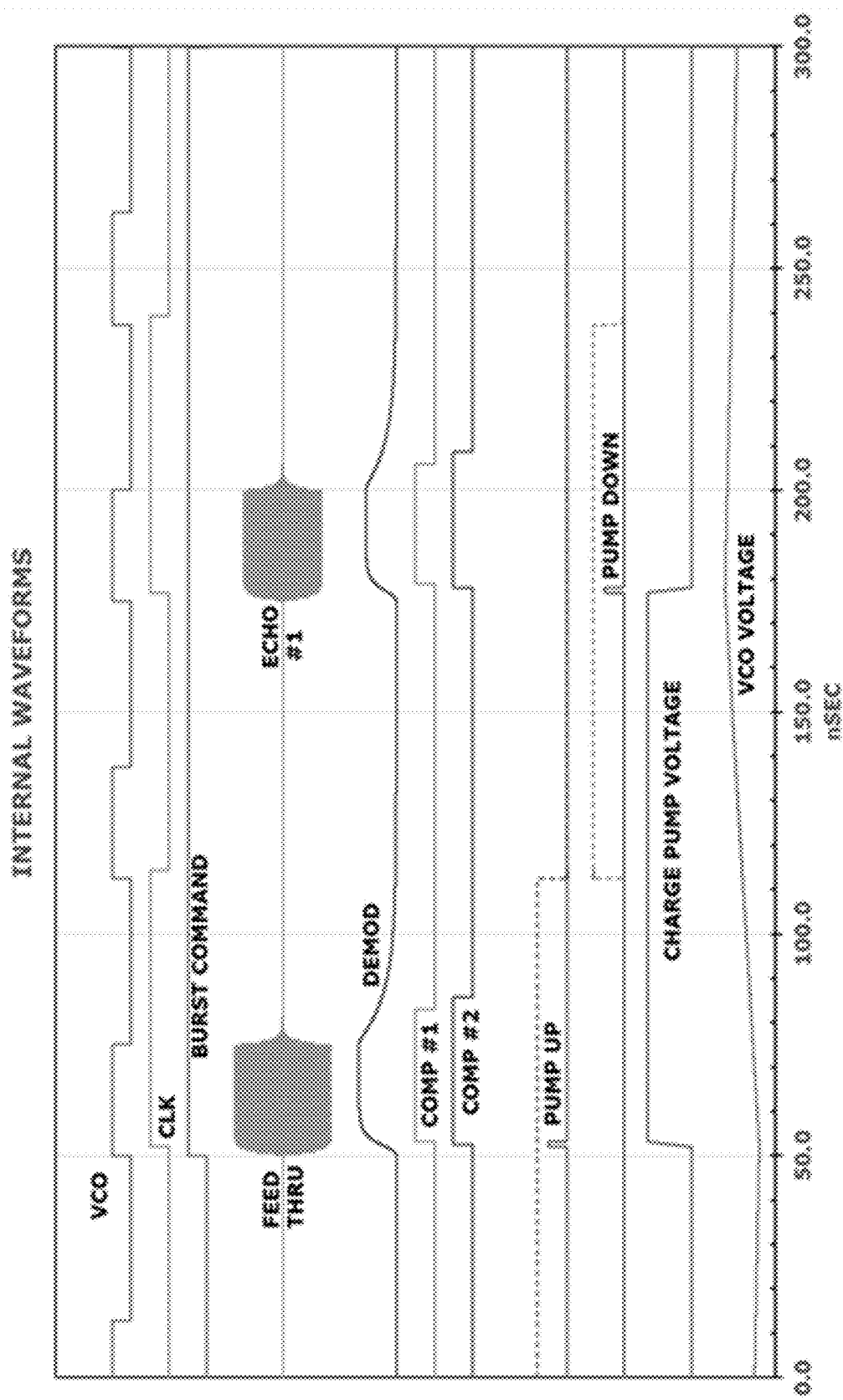
Figure 13:
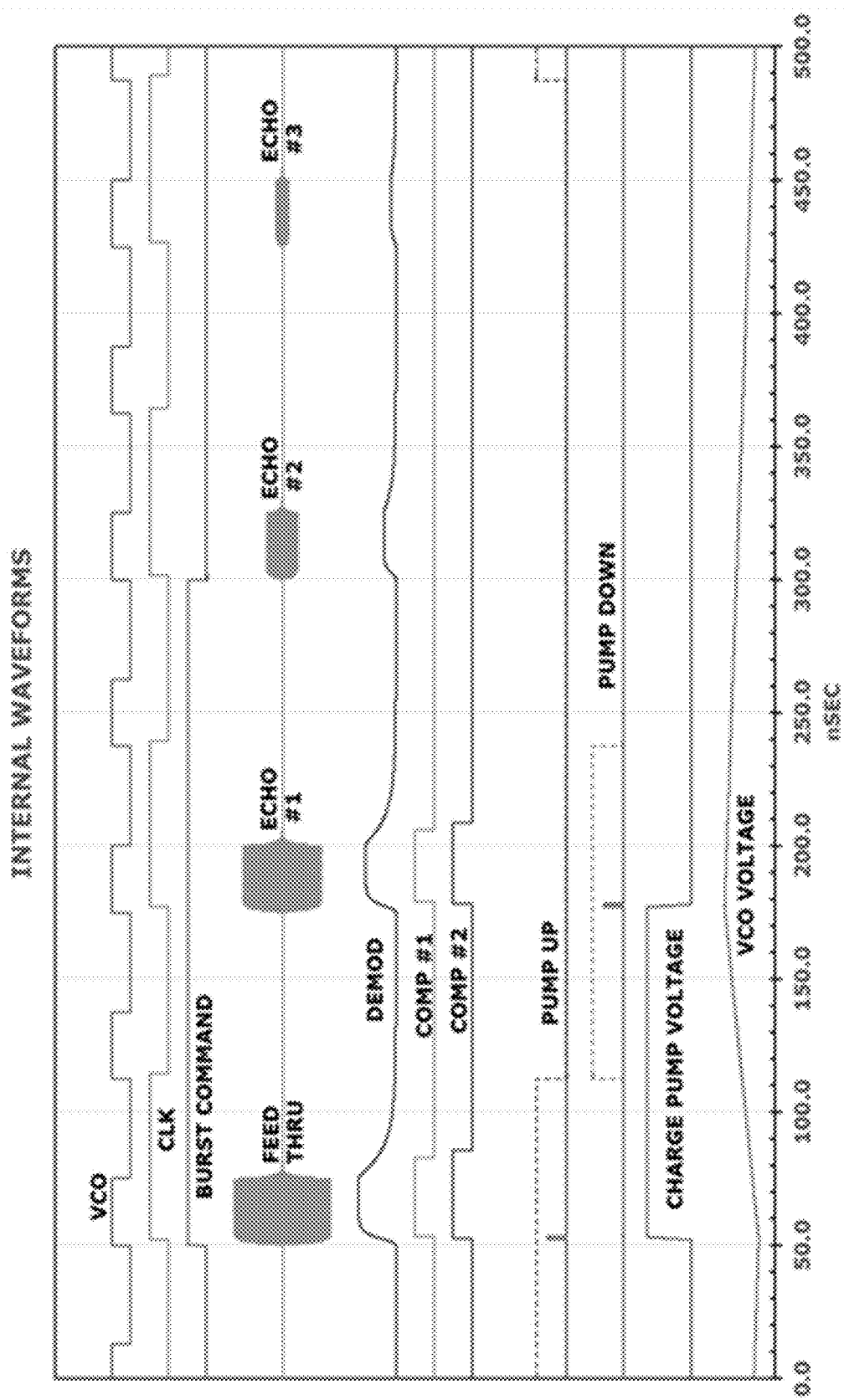
Figure 14:
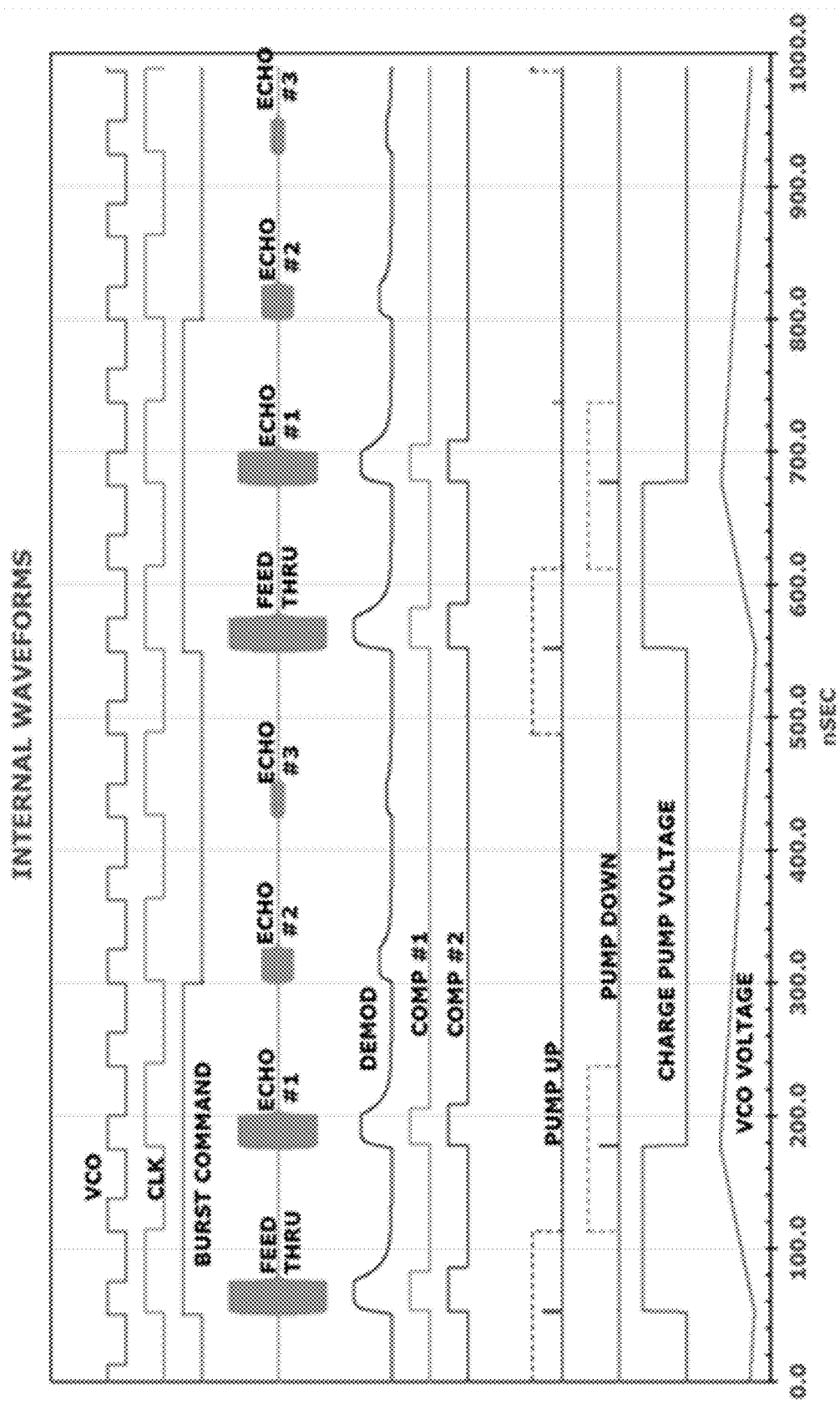

FIGS. 11-14 provide representations of waveforms for the aforementioned signals. FIG. 11 depicts a burst pulse and feedthrough pulse, FIG. 12 depicts a burst pulse, feedthrough pulse, and first echo pulse, FIG. 13 depicts a burst pulse, feedthrough pulse, first echo pulse, second echo pulse, and third echo pulse. FIG. 14 depicts two cycles of burst pulses and echo pulses. These burst pulses are initiated by the VCO and state machine. The feedthrough and first echo pulse are received by the comparators, and in response, the state machine creates PUMP UP and PUMP DOWN signals. The PUMP UP and PUMP DOWN signals are sent to the charge pump which will increase or decrease the voltage sent to the VCO. When the BAW-based clock is locked, there may be a persistent sawtooth signal on the VCO control line, but the amplitude of the sawtooth will be small enough that the resulting frequency modulation will be insignificant. The second and third echo pulses are received but may be ignored by the system 800. The next burst pulse is generated at a time where the fourth echo pulse would have occurred, but is sufficiently low in amplitude to ignore. The cycle is repeated until the system 800 is turned off.

Example Methods

In addition to the operations described above and illustrated in the figures, various operations will now be described. It should be understood that the following operations do not have to be performed in the precise order described below. Rather, various steps can be handled in a different order or simultaneously, and steps may also be added or omitted.

Figure 20:
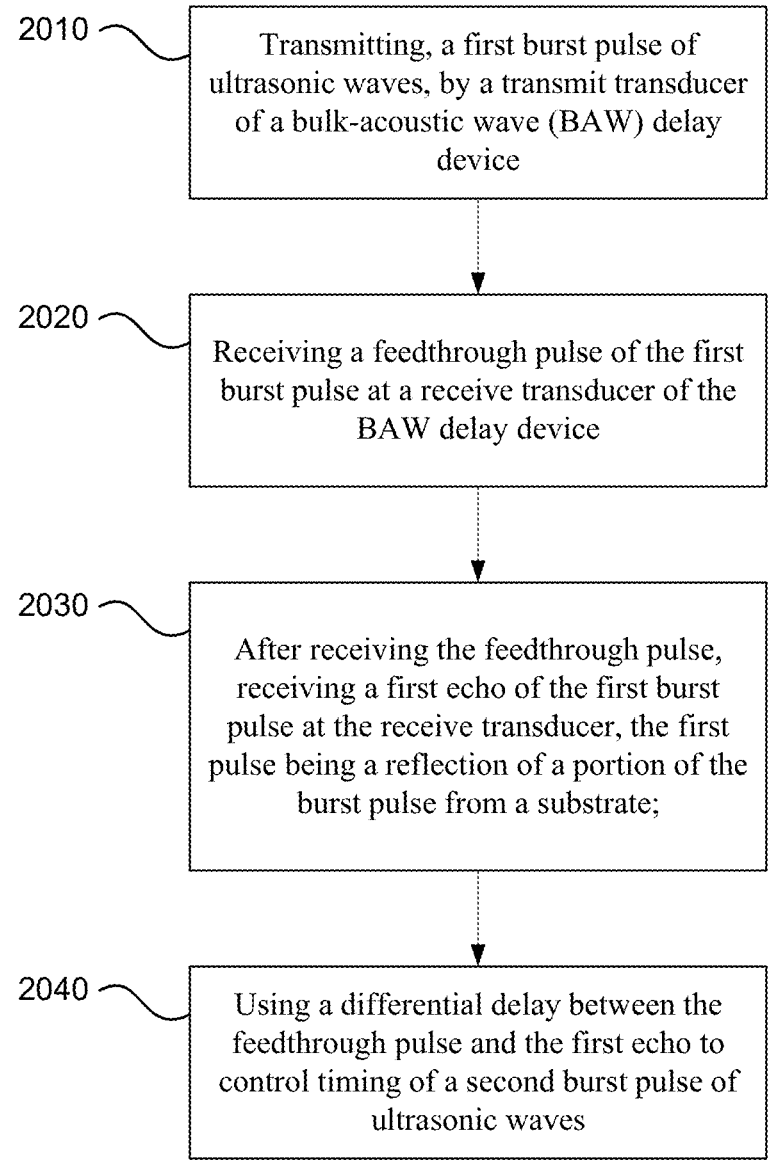
FIG. 20 is a flow diagram in accordance with aspects of the disclosure.

FIG. 20 is an example flow diagram 2000 depicting an example method of utilizing a BAW delay-based clock such as the system 800. At block 2010, a first burst pulse of ultrasonic waves, is transmitted by a transmit transducer of a bulk-acoustic wave (BAW) device. For instance, a burst pulse of microwave energy may be input to the transmitter transducer of a BAW delay device, such as the BAW transmit transducer 710 of the BAW delay device 890. As noted above, the transmit transducer 710 may convert the burst pulse of microwave energy to a burst pulse of ultrasonic waves.

At block 2020, a feedthrough pulse of the first burst pulse is received at a receive transducer of the BAW delay device. As noted above, the BAW transmit transducer 710 and the BAW receive transducer 720 may be fabricated as part of a MEMs layer above a CMOS stack which is arranged on a substrate 740. Given the coupling and proximity of the BAW transmit transducer 710 and the BAW receive transducer 720, as depicted in FIG. 7, the feedthrough pulse 760' may include a portion of the burst pulse 760 which will travel along path 762 and be received by the BAW receive transducer 720 almost immediately (e.g., within 1-2 nanoseconds) of when the burst pulse was sent.

Returning to FIG. 20, at block 2030, after receiving the feedthrough pulse, a first echo pulse of the burst pulse is received at the receive transducer. The first echo pulse is a reflection of a portion of the burst pulse from a substrate on which the bulk acoustic wave device and a CMOS stack are arranged. As depicted in FIG. 7, portion 760" of the burst pulse travels down along path 762 through the CMOS stack 730 as well as the substrate 740. When the portion of the burst pulse 760" reaches an edge 742 of the substrate 740, a difference in acoustic impedance between the substrate and the non-substrate material 750 may cause some part of the portion 766"" of the burst pulse 760 to be reflected off of the edge and back towards the BAW delay device along path

766. The portion 760′′′ of the burst pulse 760 that is received or arrives at the BAW receive transducer 710 may thus correspond to the first echo pulse.

As noted above, the duration of a burst pulse sent by the transmit transducer 710 may range between 5 and 40 nanoseconds or more or less. The timing of the receipt of the feedthrough pulse may have a very short delay from the time when the burst pulse is sent by the transmit transducer 710, for example, on the order of 1-2 nanoseconds or more or less. In addition, the feedthrough pulse may have a relatively flat delay slope with respect to the frequency of the burst pulse. In addition, the time at which the first echo pulse is received at the receive transducer 720 may be a consequence of the physical properties and geometry of the BAW substrate. Thus, a "differential delay" may be defined by determining the difference in the timing of the receipt of the first echo pulse from the timing of the receipt of the feedthrough pulse. This makes the BAW-based clock much simpler to design and produce than a differential approach using the first and second echo pulses or first and third echo pulses.

Again, the feedthrough pulse is not an echo pulse, but is processed by the CMOS circuitry identically to the first echo pulse and experiences the same non-linear delay variations with respect to temperature. Thus, both the feedthrough and first echo pulse may see the same delay variation over temperature and the differential measurement may cancel out the common non-linear variations over temperature caused by the CMOS elements of the BAW delay-based clock.

Returning to FIG. 20, at block 2040, a difference in time between the receipt of the feedthrough pulse and the receipt of the first echo pulse is used to control timing of a second burst pulse of ultrasonic waves. As described above, the feedthrough pulse and first echo pulse are received by the receive transducer 720 at different times. Thus, these signals may be sent through the BAW delay device 890 of system 800 and are received at the comparators 850, 852 at different times. Again, depending on the timing, either the feedthrough pulse or the first echo pulse may pass through each of a pair of comparators 850, 852.

Output from the comparators is input into a state machine 860 which uses the difference in time between the receipt of the feedthrough pulse and the receipt of the first echo pulse to control the timing of the burst oscillator 810's generation of the next burst pulse of microwave energy and corresponding burst pulse of ultrasonic waves. To do so, the state machine may be configured to match the transition times of the VCO 870 to the feedthrough pulse and the first echo pulse as described above. Thus, frequency of the VCO may be used to control the timing of the next burst pulse of ultrasonic waves.

Figure 15:
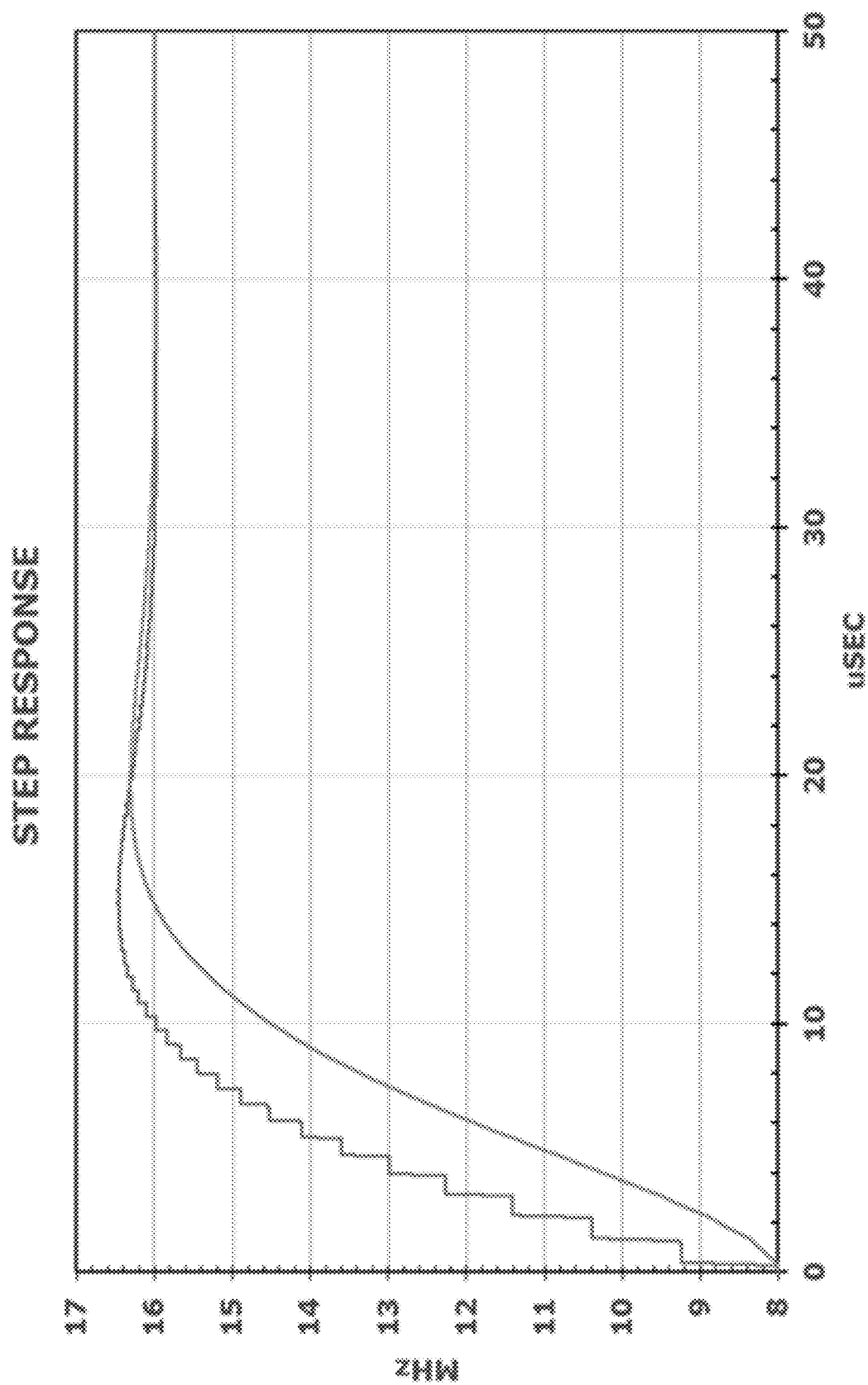
FIGS. 15 and 16 provide example simulation data for a bulk acoustic wave delay-based clock in accordance with aspects of the disclosure.
Figure 16:
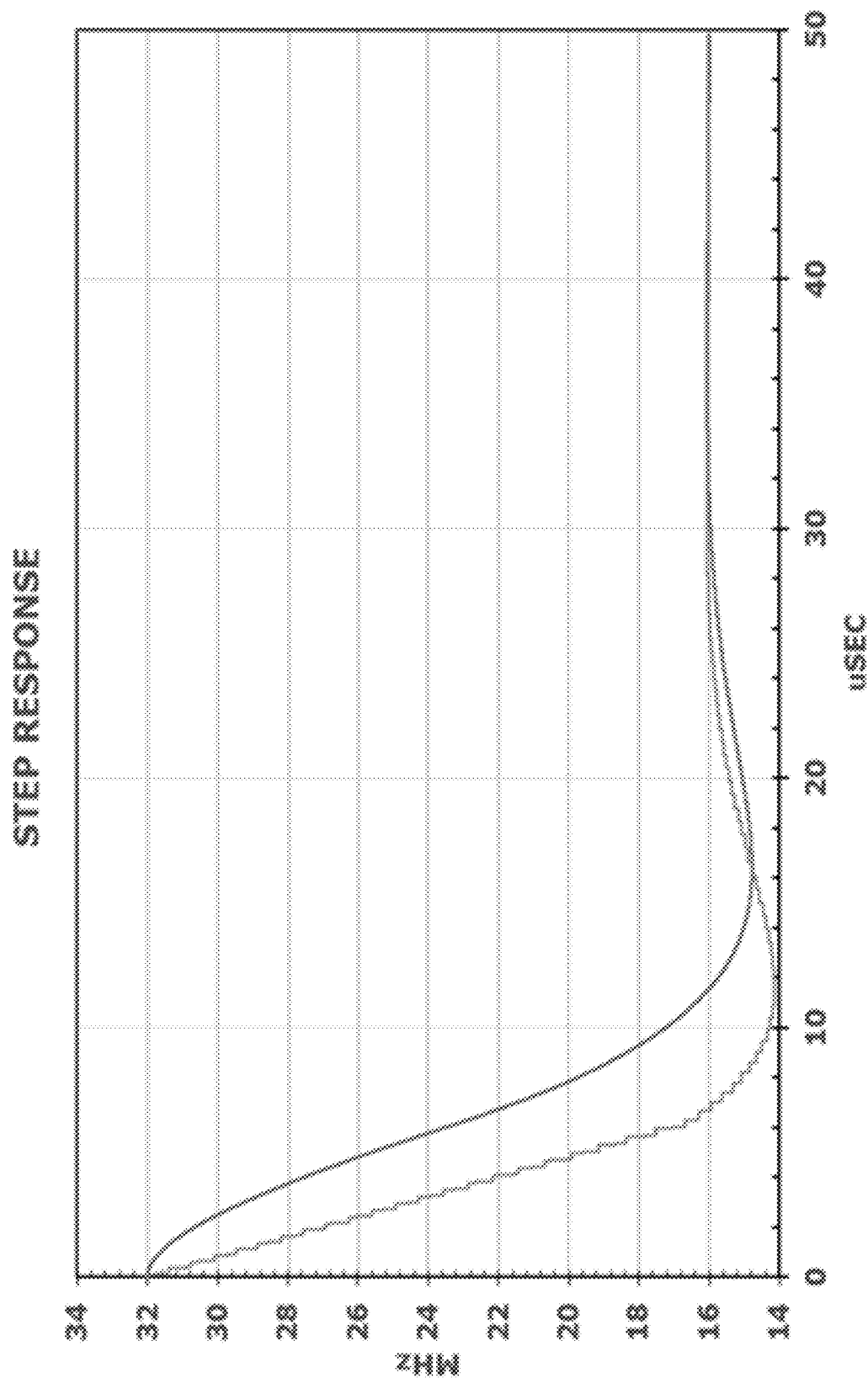

FIGS. 15 and 16 provide example simulation data for the BAW delay-based clock described herein which utilizes a 16 MHz lock frequency. In the example of FIG. 15, the burst oscillator 810 is initially set to 8 MHz, a full octave below a desired 16 MHz lock frequency. As shown, at approximately 35-40 microseconds, the frequency of the VCO settles into the 16 MHz lock frequency. g. In the example of FIG. 16, the burst oscillator 810 is initially set to 32 MHz, a full octave above the ultimate 16 MHz lock frequency. As shown, at approximately 29-34 microseconds, the frequency of the VCO settles into the desired 16 MHZ lock frequency. In both FIGS. 15 and 16, the jagged curve may be further smoothed by a loop filter, and the smooth curve is actually delivered to the VCO.

Figure 17:
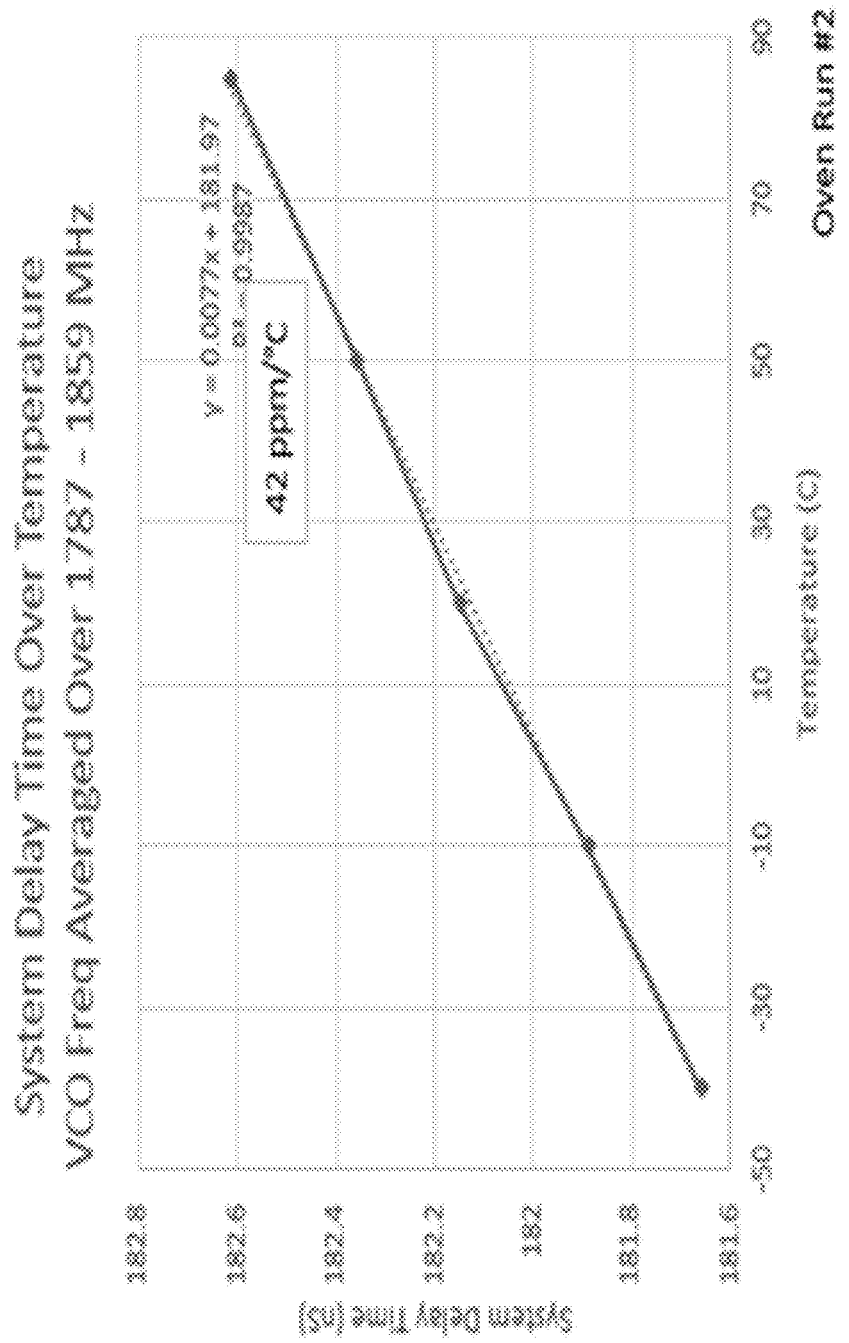
FIG. 17 provides an example graph of measured differences in time in accordance with aspects of the disclosure.

In some instances, the BAW delay-based clock may be subjected to varying temperatures. In such instances, the differential delay or the difference in time between the receipt of the feedthrough pulse and the receipt of the first echo pulse may vary. FIG. 17 provides an example graph of the measured differences in time between receipt of the feedthrough pulse and receipt of the first echo pulse in a BAW delay-based clock, such as the BAW delay device 700 and system 800 described above. In this example, as the temperature increases, the substrate acoustic velocity, or the speed of sound through the substrate, decreases. In addition, the substrate thickness expands. Both of these factors, the change in the acoustic velocity and the change in thickness of the substrate, may contribute to an increase in the difference in time. Similarly, as the temperature decreases, the speed of sound increases and the substrate contracts, which may result in a decrease in the difference in time. Both the changes in the acoustic velocity and the changes in thickness of the substrate are essentially linear with respect to temperature, and can be compensated for using additional delays as discussed further below.

In this example, the particular BAW delay device that was tested had a temperature variation slope of about 42 parts per million per degree C. (ppm/° C.). Over a temperature range of 100° C., the frequency generated by the BAW delay-based clock will vary approximately 4200 ppm. In order to maintain an accuracy of +/−50 parts ppm over temperature in the reference frequency generated by the BAW delay-based clock, the variation in the difference in time between receipt of the feedthrough pulse and receipt of the first echo pulse should be compensated to maintain a constant delay as the temperature changes. If left un-compensated, the frequency generated by a BAW delay-based clock as described herein may decrease as the difference in time increases and vice versa.

To compensate for this change in the difference in time between receipt of the feedthrough pulse and receipt of the first echo pulse, an equal but opposite delay variation over temperature may be used. A compensation circuit with linear delay variation over temperature which employs standard CMOS elements may be used. In some instances, a temperature sensor which generates a voltage linearly proportional to temperature may be used. The voltage may then be used to control a linear variable delay element or delay device.

Figure 18:
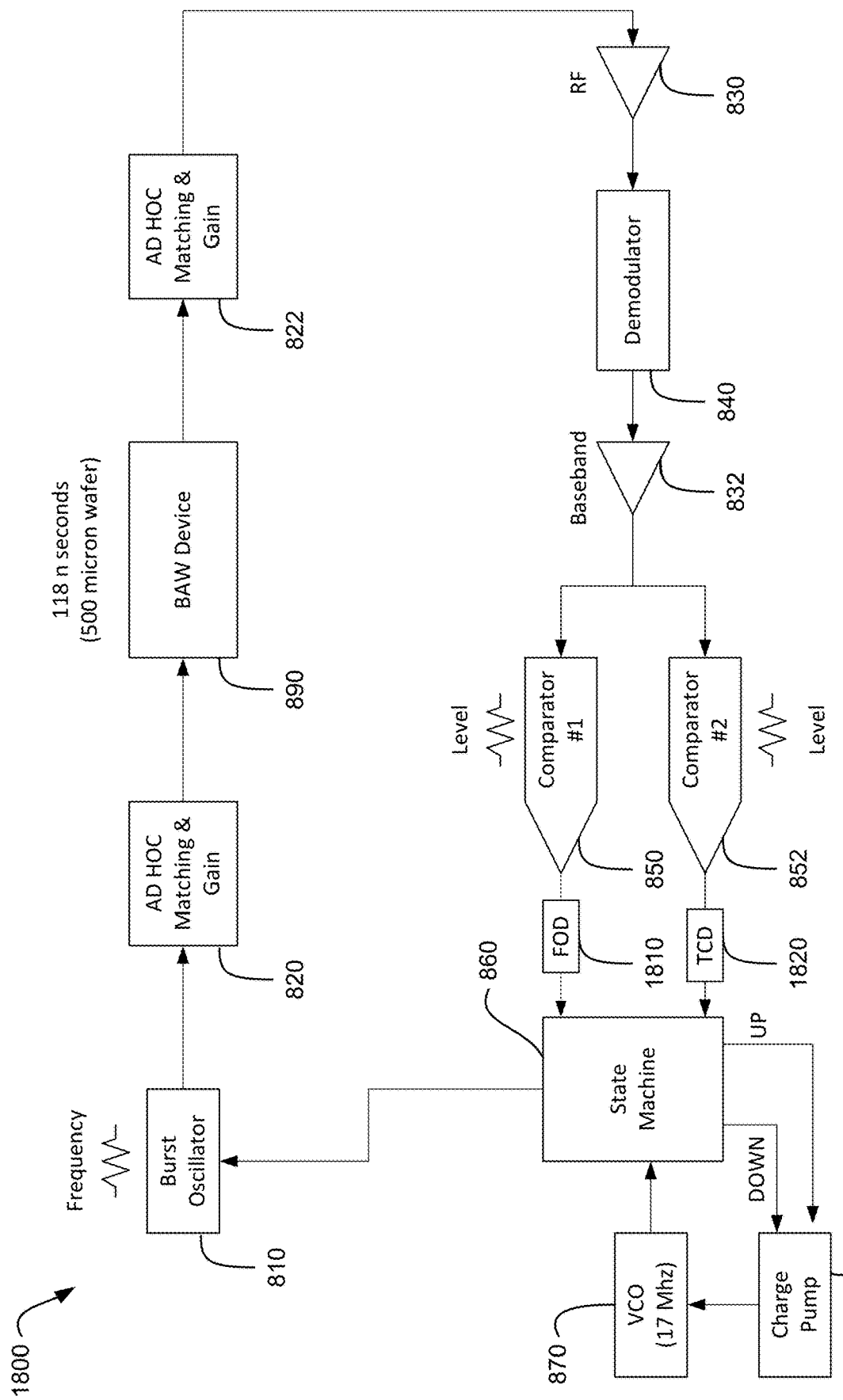
FIG. 18 is another example representation of a system in which a bulk acoustic wave device may be implemented in accordance with aspects of the disclosure.

FIG. 18 is an example system 1800 corresponding to system 800. In this example, system 1800 also includes a temperature compensation delay (TCD) device 1820 arranged between the comparator 852 and the state machine 860. In this regard, as the temperature increases, the difference in time between receipt of the feedthrough pulse and receipt of the first echo pulse increases. At the same time the delay of the TCD device is reduced by a corresponding amount.

In addition, the thickness of the substrate may be selected in order to result in a specific delay at a specific calibration temperature (e.g., a difference in time between receipt of the feedthrough pulse and receipt of the first echo pulse of X is expected at a certain temperature Y). The desired thickness may be achieved by back grinding the substrate to the selected thickness. Of course, there may be some tolerance on the back grinding which may result in a small error on the actual thickness which may thus result in an additional error in the expected difference in time between receipt of the feedthrough pulse and receipt of the first echo pulse. To compensate for this inaccuracy in the thickness, a fixed offset delay (FOD) device 1810 may be arranged between comparator 850 and the state machine 860. This may allow for compensation for the aforementioned additional error in the expected difference in time between receipt of the feedthrough pulse and receipt of the first echo pulse at the specific calibration temperature.

FIG. 19A provides an example logical schematic of an example delay device 1900. FIG. 19B provides a representation of various information and signals. In this example, the delay device 1900 may correspond to either the FOD 1810 or the TCD 1820 depending on the source of the threshold voltage 1920. For example, for the FOD 1810, the threshold voltage 1920 is a fixed (e.g., constant) value and thus, the resulting delay will be a fixed value (e.g., fixed delay value) For the TCD 1820, the threshold voltage 1920 varies with temperature. For the TCD 1820, the threshold voltage may be driven by a standard Proportion to Absolute Temperature (PTAT) circuit, and the delay will be linearly proportional to the device temperature.

In use and as depicted in FIG. 19B, a leading edge 1912 of an input pulse 1910 turns off a FET switch 1930, allowing a constant current source 1932 to begin charging a capacitor 1940. Once the rising capacitor voltage reaches the threshold voltage 1920, output of a comparator 1950 switches from low to high. This leading edge 1912 comprises the beginning of an output pulse 1960 which is delayed from the input pulse 1910 by the charging of the capacitor 1940. The time to charge the capacitor 1940 in turn depends upon the value of the threshold voltage 1920. This time delay is linearly proportional to the value of the threshold voltage. When the trailing (falling) edge of the input pulse occurs, the FET switch 1930 is turned on, discharging the capacitor 1940 and causing the output pulse 1960 to fall. The resulting output pulse 1960 has a leading edge 1962 that is delayed from the input pulse 1910 by a controllable amount and has a trailing edge 1964 that coincides with a trailing edge 1914 of the input pulse 1910.

The burst pulses generated and processed by the BAW delay-based clock may be used in timing devices as noted above. For instance, the BAW delay-based clock described herein may be used to determine the timing of sending beacon signals as well as the carrier frequency for RF transmitters in the aforementioned tracking tags (e.g., tracking tag 500, etc.).

Unless otherwise stated, the foregoing alternative examples are not mutually exclusive, but may be implemented in various combinations to achieve unique advantages. As these and other variations and combinations of the features discussed above can be utilized without departing from the subject matter defined by the claims, the foregoing description of the embodiments should be taken by way of illustration rather than by way of limitation of the subject matter defined by the claims. In addition, the provision of the examples described herein, as well as clauses phrased as "such as," "including" and the like, should not be interpreted as limiting the subject matter of the claims to the specific examples; rather, the examples are intended to illustrate only one of many possible embodiments. Further, the same reference numbers in different drawings can identify the same as or similarly elements.

The invention claimed is:

1. A method comprising:
    transmitting, a first burst pulse of ultrasonic waves, by a transmit transducer of a bulk-acoustic wave (BAW) delay device;
    receiving a feedthrough pulse of the first burst pulse at a receive transducer of the BAW delay device;
    after receiving the feedthrough pulse, receiving a first echo pulse of the first burst pulse at the receive transducer, the first echo pulse being a reflection of a portion of the first burst pulse from a substrate; and
    using a difference in time between the receipt of the feedthrough pulse and the receipt of the first echo pulse to control timing of a second burst pulse of ultrasonic waves.

2. The method of claim 1, wherein the feedthrough pulse is not an echo pulse.

3. The method of claim 1, wherein the feedthrough pulse is caused by a coupling between the transmit transducer and the receive transducer.

4. The method of claim 1, further comprising, using the first burst pulse and the second burst pulse to control timing of sending beacon signals by a tracking tag.

5. The method of claim 1, further comprising waiting a predetermined number of cycles before sending the second burst pulse.

6. The method of claim 1, wherein using the difference in time includes using first and second comparators and a state machine to control the timing of the second burst pulse.

7. The method of claim 6, wherein using the difference in time further includes using a voltage-controlled oscillator (VCO) to control the timing of the second burst pulse.

8. The method of claim 1, further comprising, using a temperature compensation delay device to adjust for temperature changes affecting thickness of the substrate and acoustic velocity of the substrate.

9. The method of claim 1, further comprising using a fixed offset delay device to adjust for an error resulting from inaccuracies in thickness of the substrate.

10. A system comprising:
    a substrate;
    a complementary metal-oxide semiconductor (CMOS) stack on which the substrate is arranged; and
    a bulk acoustic wave (BAW) delay device, the CMOS stack being arranged at least partially between the substrate and the BAW delay device, the BAW delay device including:
        a transmit transducer configured to transmit a first burst pulse of ultrasonic waves, and
        a receive transducer configured to receive a feedthrough pulse of the first burst pulse and after receiving the feedthrough pulse, receive a first echo pulse of the first burst pulse, the first echo pulse being a reflection of a portion of the first burst pulse from an edge of the substrate; and
    a state machine configured to a difference in time between the receipt of the feedthrough pulse and the receipt of the first echo pulse to control timing of a second burst pulse of ultrasonic waves.

11. The system of claim 10, wherein the feedthrough pulse is not an echo pulse.

12. The system of claim 10, wherein the feedthrough pulse is caused by a coupling between the transmit transducer and the receive transducer.

13. The system of claim 10, further comprising a tracking tag configured to use the first burst pulse and the second burst pulse to control timing of sending beacon signals by the tracking tag.

14. The system of claim 10, where the BAW delay device is further configured to wait a predetermined number of cycles before sending the second burst pulse.

15. The system of claim 10, further comprising first and second comparators configured to output signals to the state machine based on timing of the feedthrough pulse and first echo pulse, respectively.

16. The system of claim 10, further comprising a voltage-controlled oscillator (VCO) configured to be used by the state machine to control the timing of the second burst pulse.

17. The system of claim 10, further comprising a temperature compensation delay device configured to adjust for temperature changes affecting thickness of the substrate and temperature variation of acoustic velocity of the substrate.

18. The system of claim 10, further comprising a fixed offset delay device configured to adjust for an error resulting from inaccuracies in thickness of the substrate.

* * * * *